United States Patent
Crenshaw et al.

(10) Patent No.: US 7,250,334 B2
(45) Date of Patent: Jul. 31, 2007

(54) METAL INSULATOR METAL (MIM) CAPACITOR FABRICATION WITH SIDEWALL SPACERS AND ALUMINUM CAP (ALCAP) TOP ELECTRODE

(75) Inventors: Darius L. Crenshaw, Allen, TX (US); Byron L. Williams, Plano, TX (US); Alwin Tsao, Garland, TX (US); Hisashi Shichijo, Plano, TX (US); Satyavolu S. Papa Rao, Garland, TX (US); Kenneth D. Brennan, Plano, TX (US); Steven A. Lytle, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 173 days.

(21) Appl. No.: 10/909,648

(22) Filed: Jul. 31, 2004

(65) Prior Publication Data

US 2006/0024899 A1 Feb. 2, 2006

(51) Int. Cl.
*H01L 21/8242* (2006.01)
(52) U.S. Cl. .................. 438/239; 438/250; 438/251; 438/240; 257/E21; 257/351
(58) Field of Classification Search ............. 438/239, 438/250, 251, 240
See application file for complete search history.

(56) References Cited

U.S. PATENT DOCUMENTS 5,514,618 A * 5/1996 Hunter et al. ............. 438/30
6,066,537 A   5/2000 Poh
6,475,855 B1 * 11/2002 Fishburn .................. 438/239
6,569,746 B2   5/2003 Lee et al.
6,635,916 B2  10/2003 Aton
6,656,785 B2 * 12/2003 Chiang et al. ............. 438/240
2002/0096778 A1  7/2002 Cox
2002/0130388 A1  9/2002 Stamper
2003/0027385 A1  2/2003 Park et al.
2003/0102522 A1 * 6/2003 Lee ............................ 257/532
2004/0201053 A1 * 10/2004 Tu et al. ..................... 257/296
2005/0189577 A1 * 9/2005 Wang ......................... 257/303

FOREIGN PATENT DOCUMENTS

JP      2001-298154    *   9/2001

* cited by examiner

*Primary Examiner*—Asok K. Sarkar
*Assistant Examiner*—Victor V. Yevsikov
(74) *Attorney, Agent, or Firm*—Peter K. McLarty; W. James Brady, III; Frederick J. Telecky, Jr.

(57) ABSTRACT

A method (10) of forming a MIM (metal insulator metal) capacitor is disclosed whereby adverse affects associated with copper diffusion are mitigated even as the capacitor is scaled down. A sidewall spacer (156) is formed against an edge (137) of a layer of bottom electrode/copper diffusion barrier material (136), an edge (151) of a layer of capacitor dielectric material (150) and at least some of an edge (153) of a layer of top electrode material. The sidewall spacer (156) is dielectric or non-conductive and mitigates "shorting" currents that can develop between the plates as a result of copper diffusion. Bottom electrode diffusion barrier material (136) mitigates copper diffusion and/or copper drift, thereby reducing the likelihood of premature device failure.

20 Claims, 20 Drawing Sheets

METAL INSULATOR METAL (MIM) CAPACITOR FABRICATION WITH SIDEWALL SPACERS AND ALUMINUM CAP (ALCAP) TOP ELECTRODE

FIELD OF INVENTION

The present invention relates generally to semiconductor devices, and more particularly to fabricating a MIM capacitor with sidewall spacers and an aluminum capping (AL-CAP) layer serving as a top electrode.

BACKGROUND OF THE INVENTION

In the manufacture of semiconductor products such as integrated circuits, individual electrical devices are formed on or in a semiconductor substrate, and are thereafter interconnected to form circuits. Interconnection of these devices is typically accomplished by forming a multi-level interconnect network in and through one or more dielectric or non-conductive layers that are formed over the electrical devices to electrically isolate the devices from one another. A conductive material, such as copper, is deposited into vias and/or trenches formed within these dielectric layers to connect the devices and thereby establish the multi-level interconnect network.

MIM (metal insulator metal) capacitors are semiconductor devices that are formed by sandwiching a thin layer or film of dielectric material between two layers of conductive material, usually metals. The metal layers can be said to comprise some or all of top and bottom electrodes, respectively, of the capacitor. Generally the bottom electrode is in contact with a conductive copper via or trench, which can also be said to comprise some of the bottom electrode of the capacitor. At times, however, the copper can diffuse from one electrode through the dielectric layer to the other electrode and "short out" or provide a conductive pathway between the two metal layers. This can substantially compromise the capacitor's ability to perform its intended function of storing charge. This deleterious effect is only enhanced through normal operation of the capacitor as the electric field induced during operation naturally enhances the undesired transport of copper from one electrode to the other. It is therefore necessary to ensure that the MIM capacitor is designed in such a manner that the functionality of the capacitor is maintained for the required lifetime of the device and that the diffusion and/or transport of copper through the dielectric layer is sufficiently controlled or eliminated to ensure such required lifetime.

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices. For example, cellular phones, personal computing devices, and personal sound systems are devices which are in great demand in the consumer market. These devices rely on one or more small batteries as a power source and also require an ever increasing computational speed and storage capacity to store and process data, such as digital audio, digital video, contact information, database data and the like.

Accordingly, there is a continuing trend in the semiconductor industry to manufacture integrated circuits (ICs) with higher densities. To achieve high densities, there has been and continues to be efforts toward scaling down dimensions (e.g., at submicron levels) on semiconductor wafers. In order to accomplish such high densities, smaller feature sizes, smaller separations between features and layers, and/or more precise feature shapes are required. The scaling-down of integrated circuit dimensions can facilitate faster circuit performance and/or switching speeds, and can lead to higher effective yield in IC fabrication by providing more circuits on a semiconductor die and/or more die per semiconductor wafer, for example.

As device sizes continue to shrink, however, the close proximity of certain areas can lead to undesirable results. With regard to MIM capacitors, for example, bringing the metal layers closer together by reducing the thickness of the thin dielectric film can allow diffused copper to more readily short out the capacitor thereby compromising the capacitor's reliability and useful life. Still, a thin dielectric layer remains desirable as the capacitance, or ability of a capacitor to store charge, changes as a function of the distance between the metal plates, among other things. In particular, the capacitance goes up as the plates are brought closer together, but decreases as the plates are moved further apart. Accordingly, it would be desirable to fabricate a MIM capacitor in a manner that mitigates adverse effects associated with copper diffusion while concurrently allowing the size of the device to be reduced.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming a MIM (metal insulator metal) capacitor in a manner that facilitates device scaling while mitigating adverse effects associated with copper diffusion. In particular, sidewall spacers are formed along respective edges of a layer bottom electrode material, a layer of capacitor dielectric material and at least some of an edge of a layer of top electrode material. The sidewall spacers are formed from a dielectric or non-conductive material to a thickness sufficient to mitigate undesirable electron flow and, as such, the spacers serve to mitigate leakage or "shorting" currents that can develop between the bottom electrode, dielectric and top electrode layers. An excess of electron leakage current can cause the capacitor dielectric layer to become "overcharged" and/or blow. Leakage current is more likely to occur at corners of the layers where electric fields are enhanced. Accordingly, forming the sidewall spacers at the edges/corners of the layer addresses leakage current problems at the most likely "failure spots". Further, a layer of aluminum capping (ALCAP) material is utilized as at least part of a top electrode, while a metal in a topmost metallization layer is utilized as at least part of a bottom electrode. In this manner, resulting devices are formed as away from the silicon substrate as possible. This distance away from the substrate is advantageous for RF applications in that the quality factor (a figure of merit for RF performance) increases with distance for the "lossy" substrate. This is particularly true where the substrate comprises silicon.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
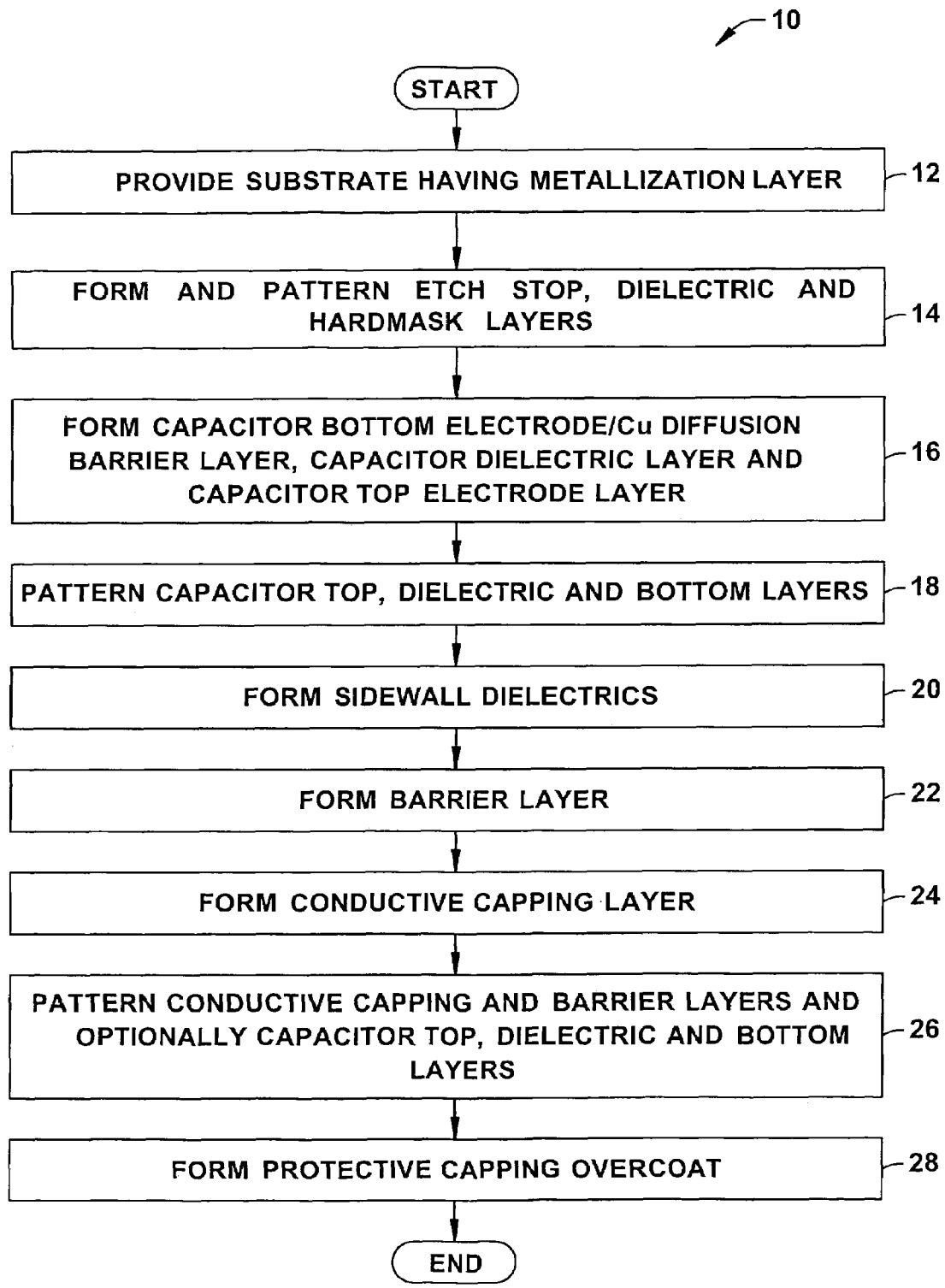
FIG. 1 is a flow diagram illustrating an exemplary methodology for forming a three dimensional MIM (metal insulator metal) capacitor in accordance with one or more aspects of the present invention.

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

The present invention relates to forming a MIM (metal insulator metal) capacitor in a manner that facilitates device scaling while mitigating adverse effects associated with copper diffusion. In particular, sidewall spacers are formed along respective edges of a layer bottom electrode material, a layer of capacitor dielectric material and at least some of an edge of a layer of top electrode material. The sidewall spacers are formed from a dielectric or non-conductive material to a thickness sufficient to mitigate undesirable electron flow and, as such, the spacers serve to mitigate leakage or "shorting" currents that can develop between the bottom electrode, dielectric and top electrode layers. An excess of electron leakage current can cause the capacitor dielectric layer to become "overcharged" and/or blow. Leakage current is more likely to occur at corners of the layers where electric fields are enhanced. Accordingly, forming the sidewall spacers at the edges/corners of the layer addresses leakage current problems at the most likely "failure spots". Further, a layer of aluminum capping (ALCAP) material is utilized as at least part of a top electrode, while a metal in a topmost metallization layer is utilized as at least part of a bottom electrode. In this manner, resulting devices are formed as away from the silicon substrate as possible. This distance away from the substrate is advantageous for RF applications in that the quality factor (a figure of merit for RF performance) increases with distance for the "lossy" substrate. This is particularly true where the substrate comprises silicon.

Turning to FIG. 1, an exemplary methodology 10 is illustrated for forming a MIM (metal insulator metal) capacitor according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a MIM capacitor as illustrated and described below with respect to FIGS. 2-16, as well as to devices not shown or described herein.

The methodology 10 begins at 12 wherein a semiconductor substrate is provided or obtained that has been processed through formation of a topmost metallization layer. It is to be appreciated that substrate or semiconductor substrate as used herein can include a base semiconductor wafer or any portion thereof (e.g., one or more wafer die) as well as any epitaxial layers or other type of semiconductor layers formed thereover and/or associated therewith. The substrate can comprise, for example, silicon, SiGe, GaAs, InP and/or SOI. In addition, the substrate can include various device elements formed therein such as transistors, for example, and/or layers thereon. These can include metal layers, barrier layers, dielectric layers, device structures, including silicon gates, word lines, source regions, drain regions, bit lines, bases, emitters, collectors, conductive lines, conductive vias, etc. After obtaining the substrate, the methodology advances to 14 wherein layers of an etch stop material, a dielectric material and hardmask material are sequentially formed over the substrate and then patterned (e.g., via etching and/or lithographic techniques).

Figure 2:
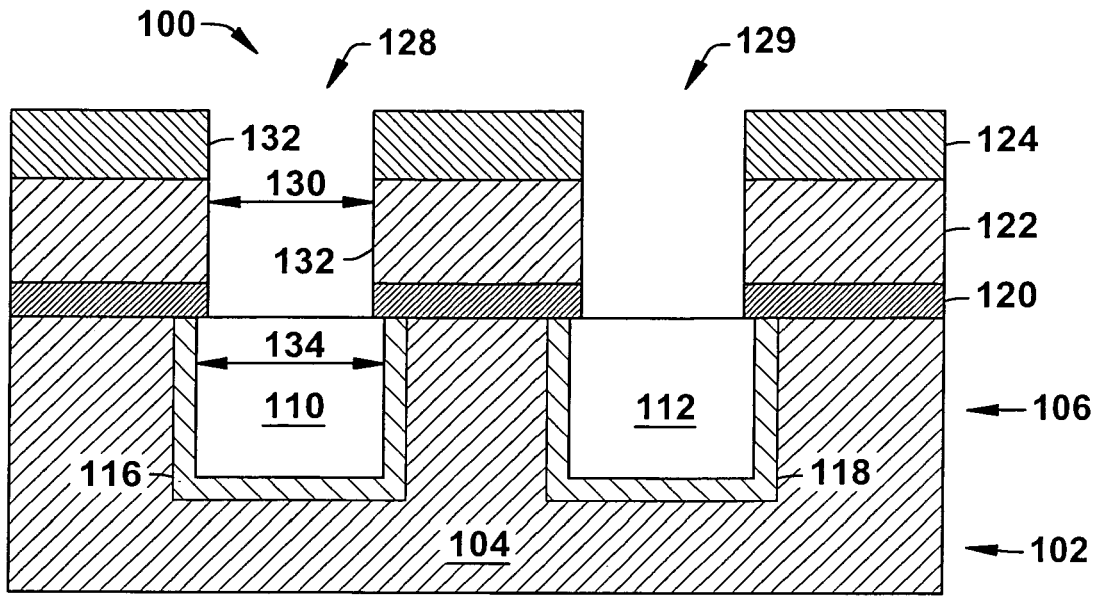
FIGS. 2-16 are cross-sectional illustrations of a MIM capacitor being formed according to one or more aspects of the present invention, such as that set forth in FIG. 1.
Figure 3:
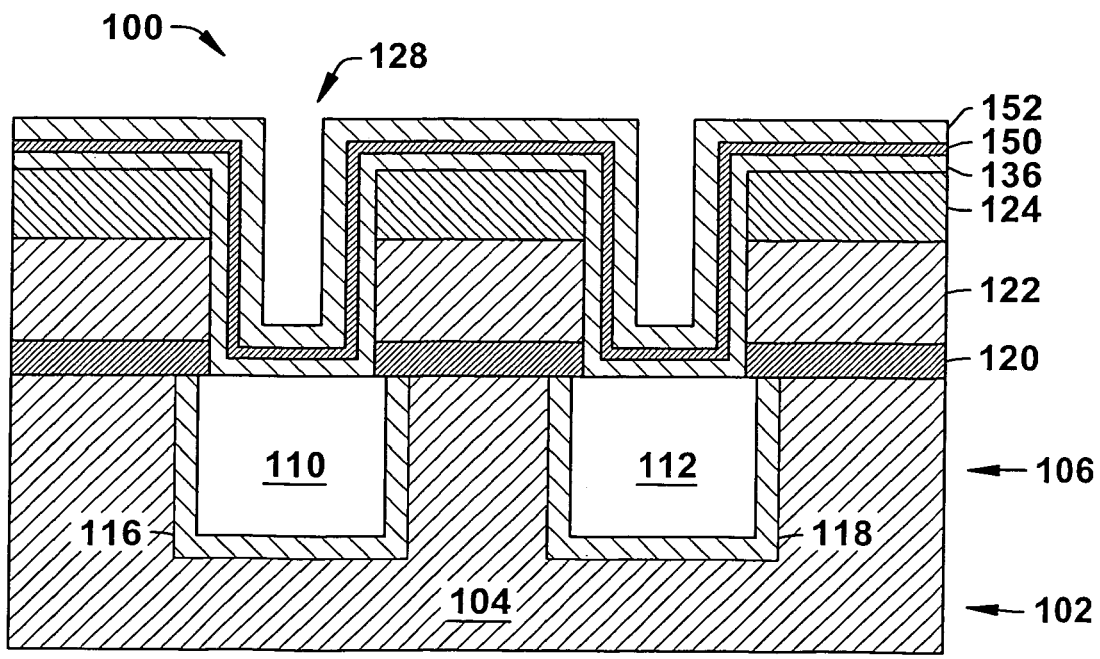

FIG. 2 is a cross-sectional illustration of a MIM capacitor 100 processed through this stage of fabrication. The substrate 102 includes, but is not limited to, an interlayer or interlevel dielectric 104 and a topmost metallization layer 106. The metallization layer 106 includes dielectric material and one or more metals, two in the illustrated example 110, 112. The metals form conductive lines and facilitate electrical contact with surrounding structures through vias and/or trenches formed within dielectric layers. In the illustrated example, the metals are surrounded by respective diffusion barriers 116, 118. The metals 110, 112 generally include copper while the diffusion barriers 116, 118 may include tantalum, or a variety of other barriers, for example. It is to be appreciated that the substrate 102 can include one or more metallization layers that are not illustrated in addition to other non-illustrated device elements. Further, the metallization layer 106 may comprise on or more layers of metallization as may be desired.

A layer of an etch stop material 120 is formed over the substrate 102 and the metals 110, 112, with a layer of a dielectric material 122 formed over the etch stop layer 120 and a layer of a hardmask material 124 formed over the dielectric layer 122. Layer 120 may also be referred to as a protective overcoat in that it provides electrical isolation and/or mechanical protection for underlying layers and/or structures. It may also provide chemical and/or ion protection, among other things, for example. Additionally, layer 120 may also include one or more layers that may comprise silicon nitride, silicon oxynitride, silicon oxide, silicon dioxide, silicon carbonitride, organic polymers such as polyimide and/or other materials, for example. Layer 120 can be referred to as an etch stop layer because of its selectivity to different etching chemistries. For example, layer 120 may not be etched when layer 122 is etched or it may be etched at a much slower rate than layer 122. Thus, layer 120 may "signal" when layer 122 has been etched through. By way of example only and not limitation, layer 120 can be formed to a thickness of between about 300 to about 800 angstroms.

Similarly, layers 122 and 124 may also be referred to as protective overcoats and may include one or more layers. Layer 124 can be an optional layer and can be chosen to be included or to be left out by one skilled in the art. Layer 122 may include an oxide based material formed to between about 3000 to about 5000 angstroms, for example, whereas layer 124 may include silicon oxynitride and/or silicon carbide, silicon nitride, or silicon oxide, for example. Layer 124 can be formed to between about 300 to about 2000 angstroms, for example. Further, the layer of dielectric material 122 may include low dielectric constant (low-k) materials, which may or may not be porous. Examples of low-k materials include spin-on-glasses (SOGs), as well as organic and/or quasi-organic materials such as silsesquioxanes, fluorinated silica glasses (FSGs) and fluorinated polyarylene ethers. Other low-k insulator materials include organo-silicate-glasses (OSGs), for example, having dielectric constants (k) as low as about 2.6-2.9, and ultra low-k dielectrics having dielectric constants below 2.6. OSG materials, for example, may be low density silicate glasses to which alkyl groups have been added to achieve a low-k dielectric characteristic. It may be desirable to utilize low-k materials between conductive (metal) layers since the low-k materials may reduce capacitive coupling between the layers and reduce RC delay times and thereby increase circuit speed.

The layer of etch stop material 120, layer of dielectric or capacitor ILD material 122 and layer of hardmask material 124 are patterned so that respective apertures 128, 129 are formed therein over the first and second metals 110, 112, respectively. It will be appreciated that the aperture 128 is formed so that a width 130 of the aperture 128 between sidewalls 132 can be slightly smaller than a width 134 of the first metal 110. As with all layers described herein (unless specifically indicated to the contrary), layers 120, 122, 124 can be patterned in any suitable manner, such as via etching and/or lithographic techniques. Lithography refers to processes for pattern transfer between various media. A radiation sensitive resist coating is formed over one or more layers to which the pattern is to be transferred. The resist is itself first patterned by exposing it to radiation, where the radiation (selectively) passes through an intervening mask containing the pattern. As a result, the exposed or unexposed areas of the resist coating become more or less soluble, depending on the type of resist used. A developer is then used to remove the more soluble areas leaving the patterned resist. The pattered resist can then serve as a mask for the underlying layers which can be selectively etched to transfer the pattern thereto.

Next, at 16 in FIG. 1, a layer of bottom electrode/copper diffusion barrier material, a layer of capacitor dielectric material and a layer of top electrode material are formed. This can be seen in FIG. 3 wherein the layer of bottom electrode material 136 is formed over the layer of hardmask material 124 and down into the aperture 128 onto the metal 110. Since this bottom electrode layer 136 is conductive and is in contact with metal 110, which generally contains copper (and which can also be thought of as comprising part of the bottom electrode), layer 136 has to serve as a copper diffusion barrier. Accordingly, layer 136 may contain tantalum and/or tantalum nitride, for example, and may be formed to a thickness of between about 100 to about 400 angstroms, for example.

The layer of capacitor dielectric material 150 and layer of capacitor top electrode material 152 are similarly formed over layer 136 and down into aperture 128. As with all layers described herein (unless stated to the contrary), these layers are substantially conformally formed. It will be appreciated that the capacitor dielectric layer 150 can be formed of any one or more suitable materials, such as nitride based materials and/or those set forth above with regard to the layer of dielectric material 122. It will also be appreciated that it may be desirable at times to form different dielectric layers from the same or similar materials so that the layers have similar reactions to subsequent treatments (e.g., etching, CMP). At other times, however, it may be desirable to form different layers from different materials so that they respond differently to subsequent treatments (e.g., have different etch rates).

Layer 150 may be formed in any suitable manner, such as via low temperature (e.g., less than or equal to about 400 degrees Celsius when Copper is present) plasma enhanced chemical vapor deposition (PECVD), for example, but is generally formed to a thickness of less than about 600 angstroms, for example. The layer of top electrode material 152 can likewise be formed in any suitable manner (e.g., CVD) from any suitable materials (e.g., Ta, TaN) to a thickness of between about 400 to about 900 angstroms, for example. Layer 152 is conductive and also serves as a barrier to limit copper diffusion. Additional functions of layer 152 include preventing capacitor punchthrough during subsequent etches. Capacitor punchthrough refers to a failure mode caused by a subsequent etch in a downstream fabrication process that etches through layer 152 and also etches into or completely through layers 150 and 136. The punchthrough aperture could be filled with a conductive material during processing and thereby short out the capacitor. Layer 152 can act as an etch stop for subsequent etches preventing further etching into layer 150 and below. Further functions of layer 152 can include providing low electrical resistance between other metallization layers and/or surrounding metals that fill vias, as well as providing good adhesion between such metals.

Figure 4:
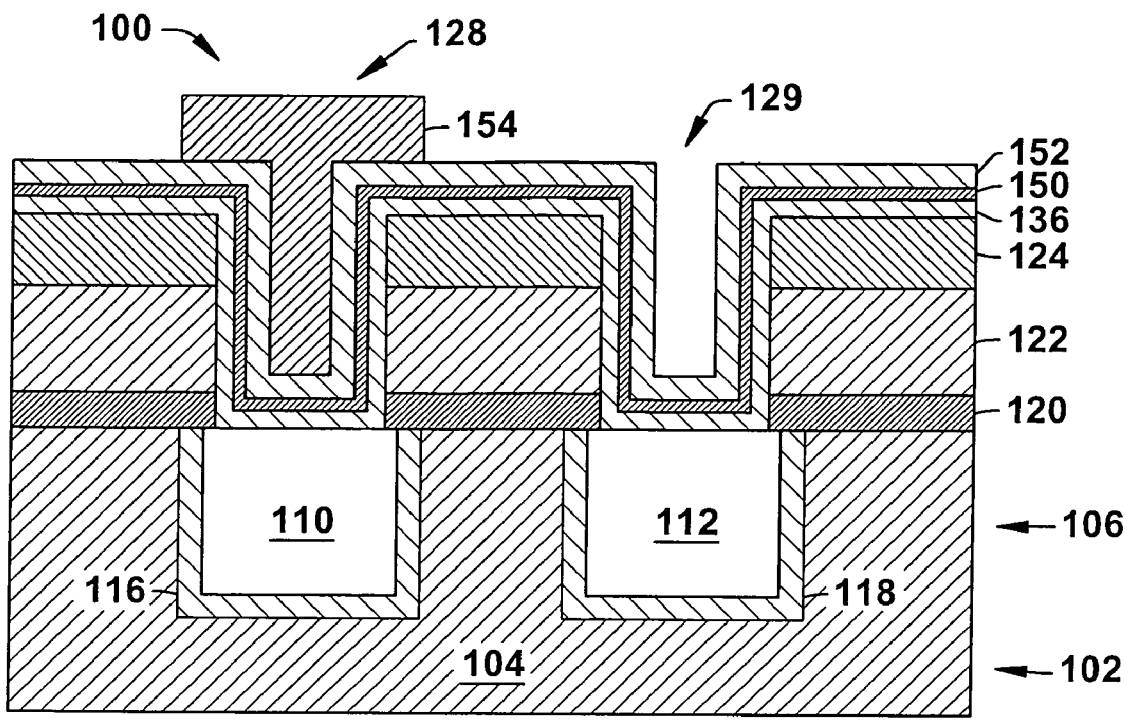
Figure 5:
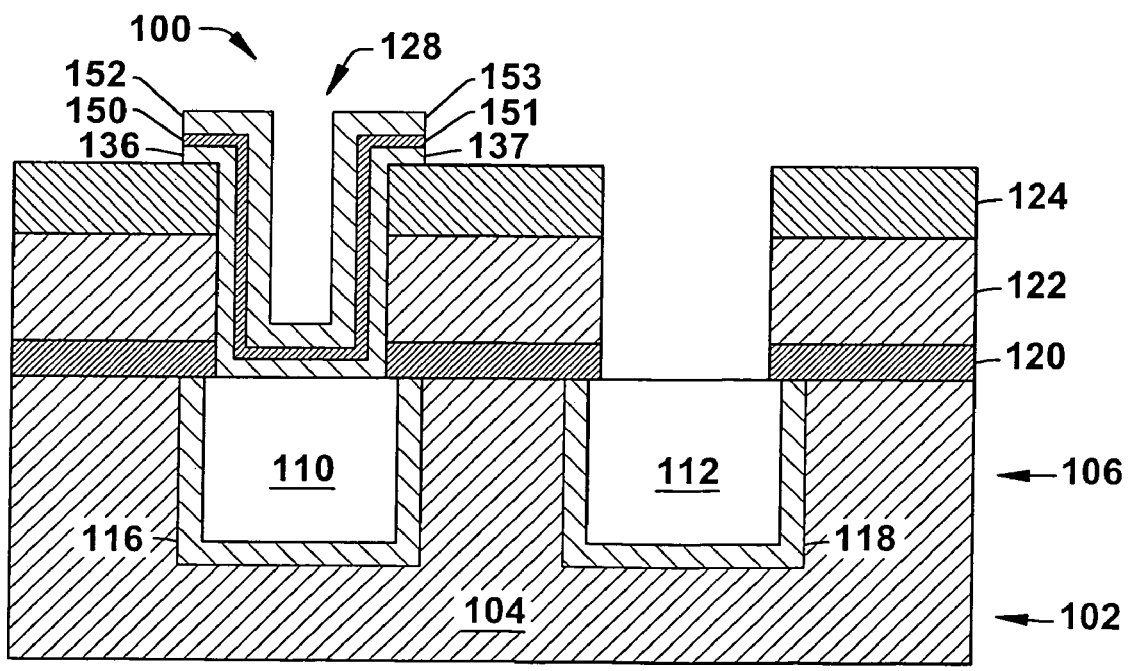

At 18, the top electrode, capacitor dielectric and bottom electrode layers are patterned over the first aperture. FIG. 4 illustrates a layer of resist material 154 that has been patterned over the first aperture 128. This patterned resist 154 serves as a mask for one or more subsequent etching steps whereby the layer of top electrode material 152, layer of capacitor dielectric material 150 and layer of bottom electrode material 136 are removed everywhere except under the patterned resist 154 (FIG. 5). It will be appreciated that in the illustrated example, a non-directional or isotropic etch is implemented so that layers 152, 150 and 136 are removed from the sidewalls of aperture 129. After the top electrode 152, capacitor dielectric 150 and bottom electrode 136 layers have been patterned, the patterned resist 154 is also removed (e.g., washed away) (FIG. 5). In the illustrated example, respective edges 137, 151 and 153 of layers 136, 150 and 152 are substantially parallel or "flush" with one another. While this is preferable, it is not, however, required. Further, it is generally preferable that edges be formed outside of or above the first aperture 128. It will be appreciated that the etch that removes layers 136, 150, and 152 will likely be anisotropic (e.g., highly directional). In this case, a sidewall tri-layer of these layers will exist in trench 129. This is not illustrated in FIG. 5, however, for purposes of simplicity.

Figure 6:
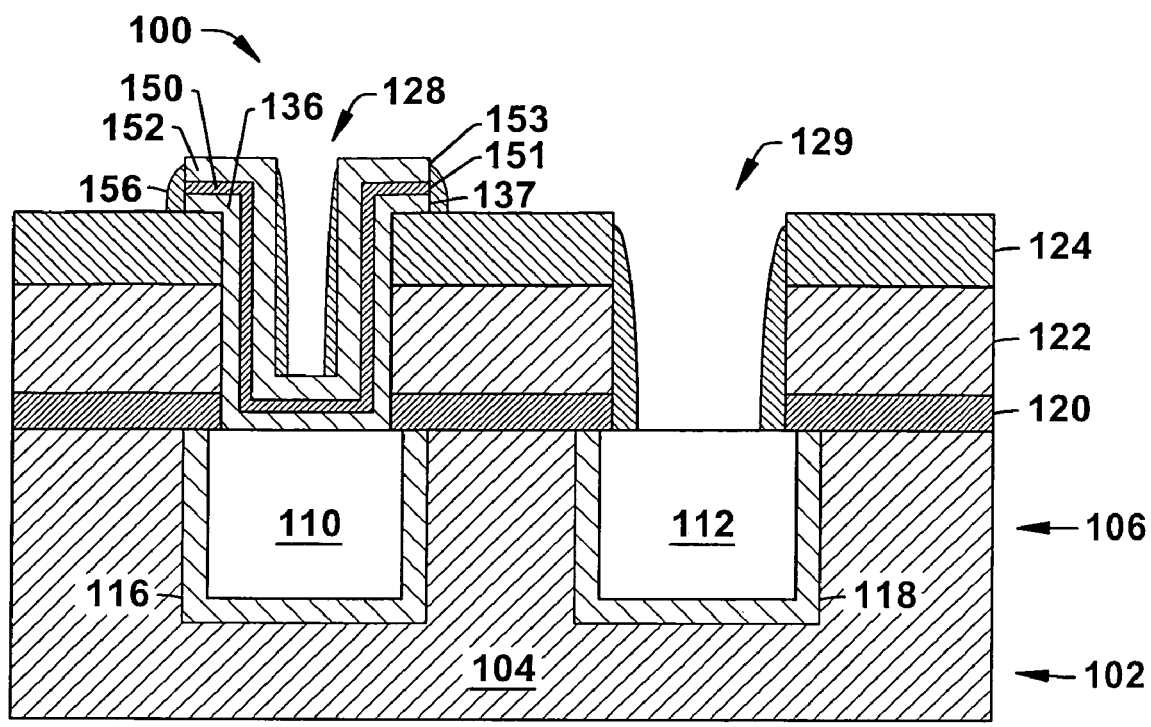

At 20, sidewall dielectric spacers are formed next to the top electrode, capacitor dielectric and bottom electrode layers. More particularly, as illustrated in FIG. 6, the sidewall spacers 156 are formed adjacent to the respective edges 137, 151 and 153 of layers 136, 150 and 152. The spacers 156 are formed from a layer of dielectric material which is conformally formed over all of the layers and apertures (not shown). The layer of material may comprise, for example, nitride and/or oxide based materials and can be formed to a thickness of about 500 or more angstroms, for example. This dielectric material is then etched so as to be substantially removed everywhere except along edges 137, 151 and 153. Some sidewall material may also remain within apertures 128 and 129, however.

Figure 7:
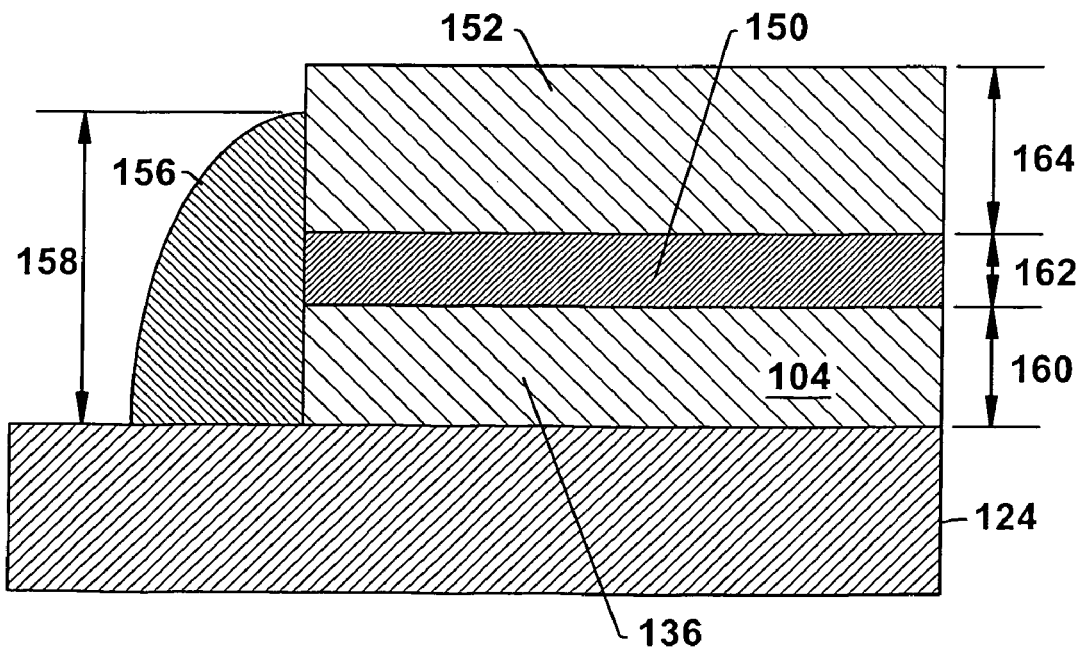

Turning to FIG. 7, an enlarged illustration of a sidewall spacer 156 demonstrates that the sidewall spacers 156 are formed so as to cover all of the edges 137, 151 of the bottom electrode 136 and capacitor dielectric 150 layers and at leas some of the edge 153 of the top electrode layer 152. In this manner, the spacers 156 can be said to have a height 158 that is greater the sum of a height 160 of the bottom electrode layer 136 plus a height 162 of the capacitor dielectric layer 150, but is less than the sum of the height 160 of the bottom electrode layer 136 plus the height 162 of the capacitor dielectric layer 150 plus a height 164 of the top electrode layer.

It can be seen that the capacitor 100 formed in accordance with one or more aspects of the present invention has somewhat of a "u" shape (FIG. 6). It will be appreciated that while "shorting" due to copper diffusion can occur anywhere along a capacitor having such a configuration, it is more likely to occur at edges 137, 151 and 153 of layers 136, 150 and 152. For example, higher electric fields that promote shorting exist at the corners of these edges. However, any such tendency to "short" at these edges is mitigated by the sidewall spacers 156 formed in accordance with one or more aspects of the present invention. In particular, the spacers provide an electrical barrier between edges 137 and 153 of layers 136 and 152 at places where the ALCAP layer is routed away from the capacitor to an another top metal layer. An important aspect of the design disclosed herein is that the ALCAP layer is used as a routing layer as well as a bonding layer. A device formed without spacers as disclosed herein would have zero yield because the ALCAP barrier layer would short layer 152 to layer 136 (as shown later). The presence of layer 136 over top metal layers 110 and 112 is advantageous as compared to over conventional MIM capacitor structures built in a Cu dual damascene back-end-of-line (BEOL) process. The presence of diffusion barrier layer 136 between the Cu (layers 110 and 12) and the dielectric layer (15) mitigates (both thermal and field-enhanced) Cu diffusion. When the top electrode (layer 152) is biased negatively, Cu+ions have been observed to "drift" through most dielectrics if the field is high enough. This diffusion current is known as "Cu drift". Mitigating such diffusion current avoids yield and performance loss, and allows a more repeatable capacitance density to be achievable across the wafer from the manufacturing process. Further, since a topmost metallization layer is utilized, noise from the surface of the wafer or substrate is less likely to reach the capacitor allowing the device to perform to lifetime and reliability requirements.

Figure 8:
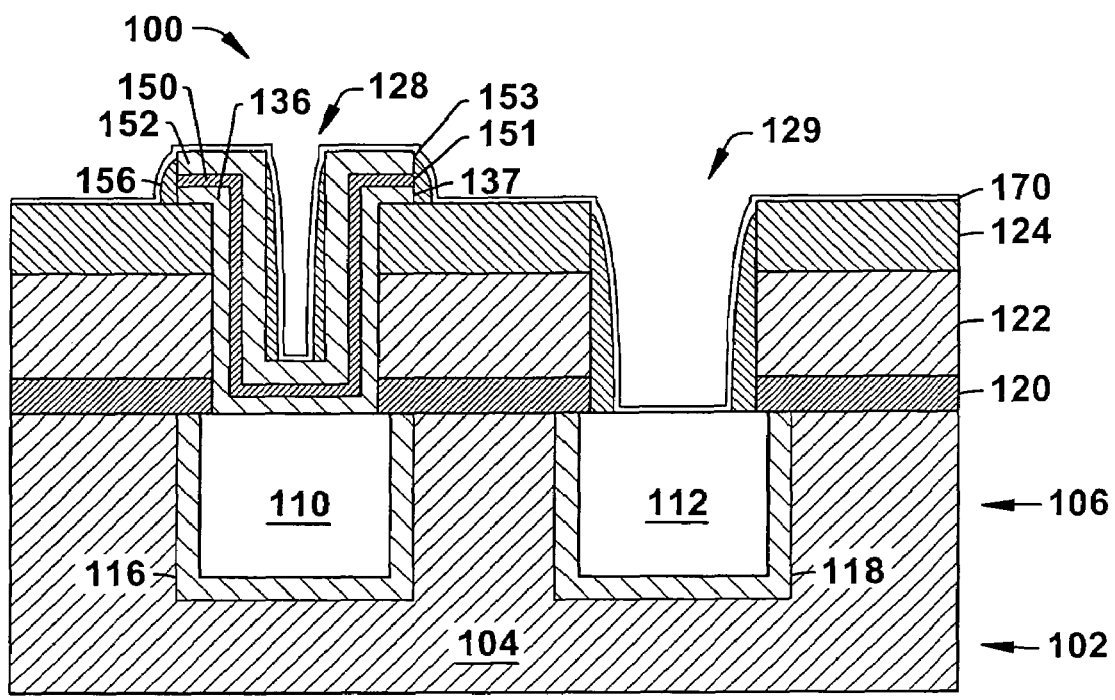
Figure 9:
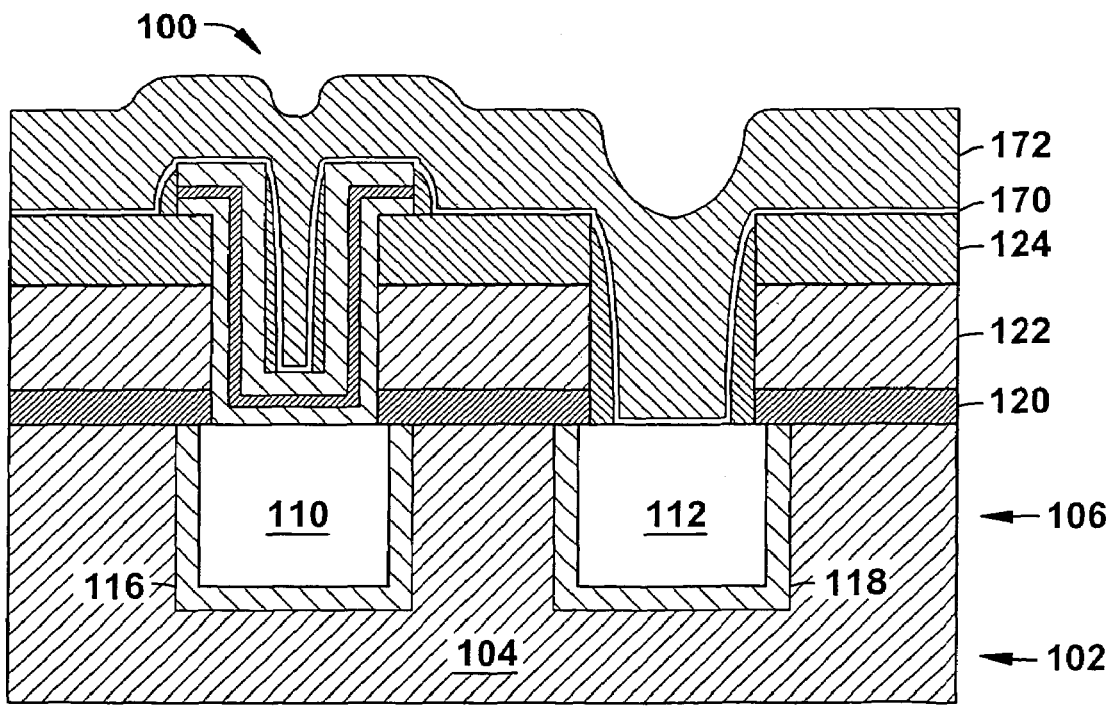
Figure 10:
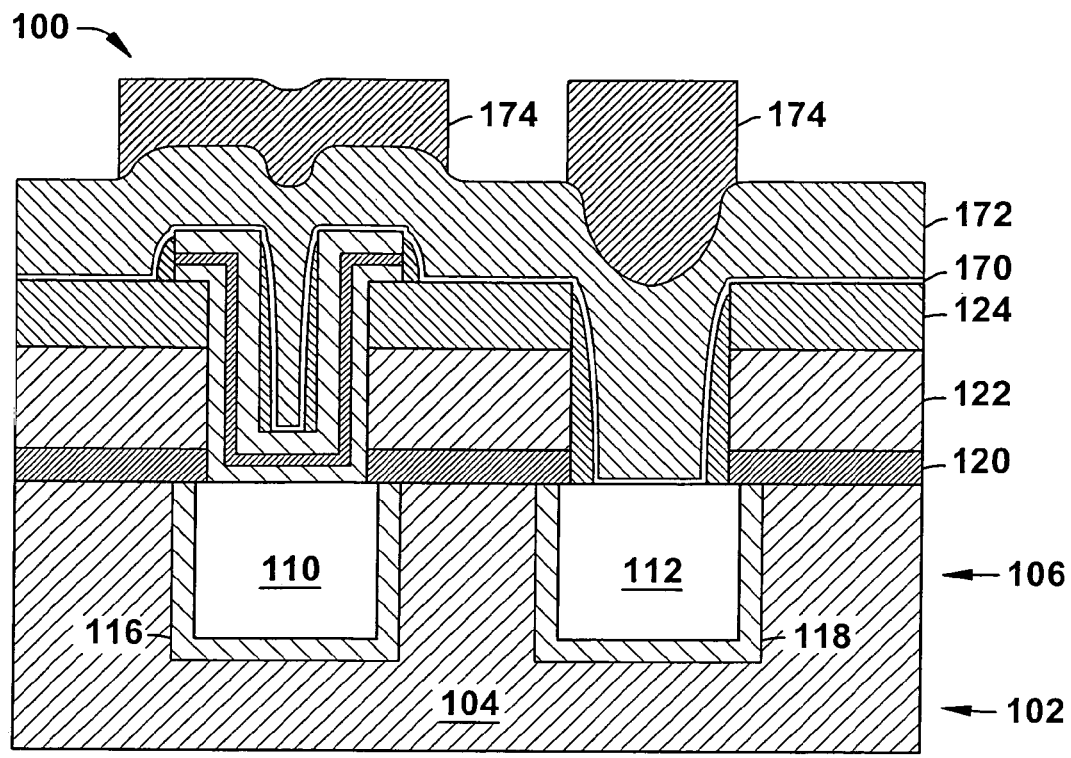

The methodology 10 then proceeds to 22 wherein a layer of barrier material is formed. FIG. 8 illustrates that this layer 170 is formed over the top electrode layer 152, sidewall spacers 156 and down into apertures 128, 129. This layer serves as a copper diffusion barrier and as such is may be formed from tantalum, for example. The layer of barrier material 170 may be formed to a thickness of generally less than about 500 angstroms, for example. At 24 a layer of aluminum capping (ALCAP) material 172 is formed over the layer of barrier material (FIG. 9). This layer 172 may include aluminum in conjunction with any other suitable material(s), and is generally formed to between about 7000 to about 10,000 (1 micron) angstroms, for example.

Figure 11:
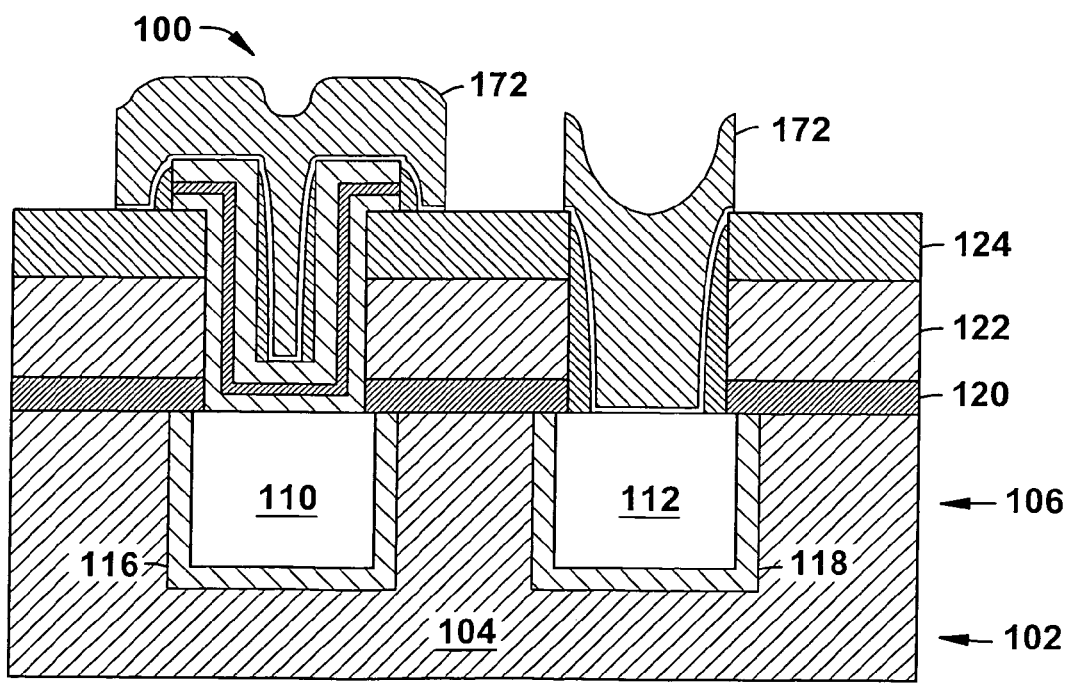
Figure 12:
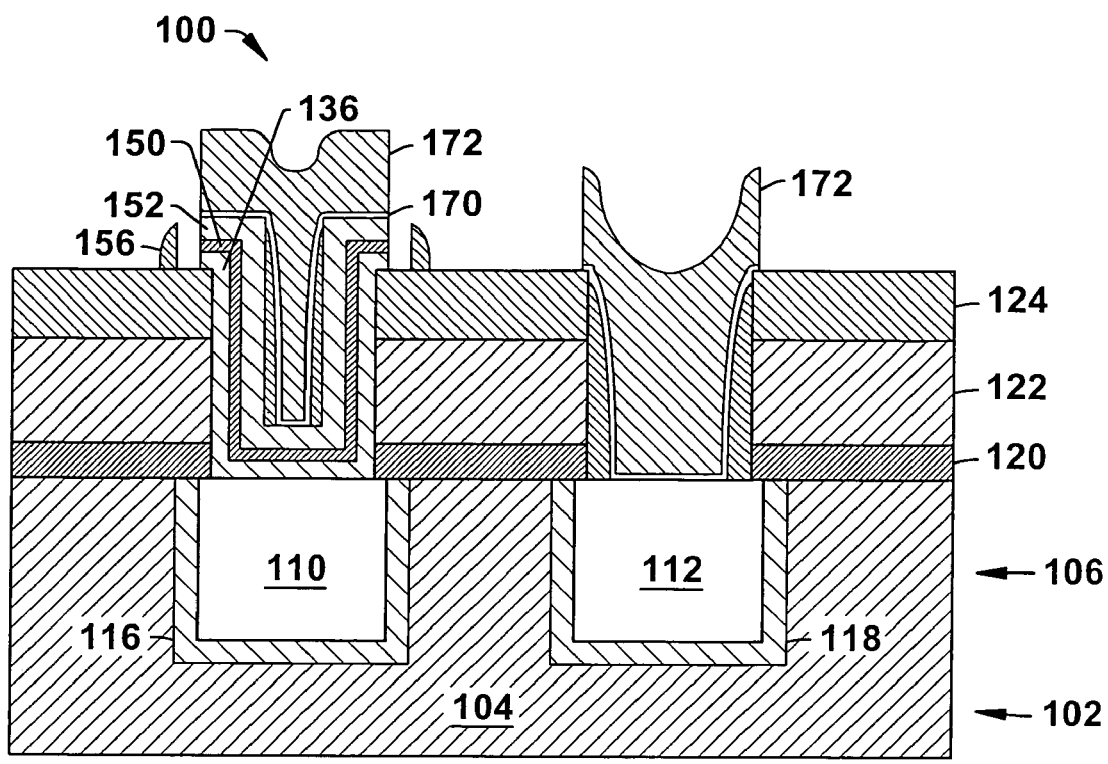
Figure 13:
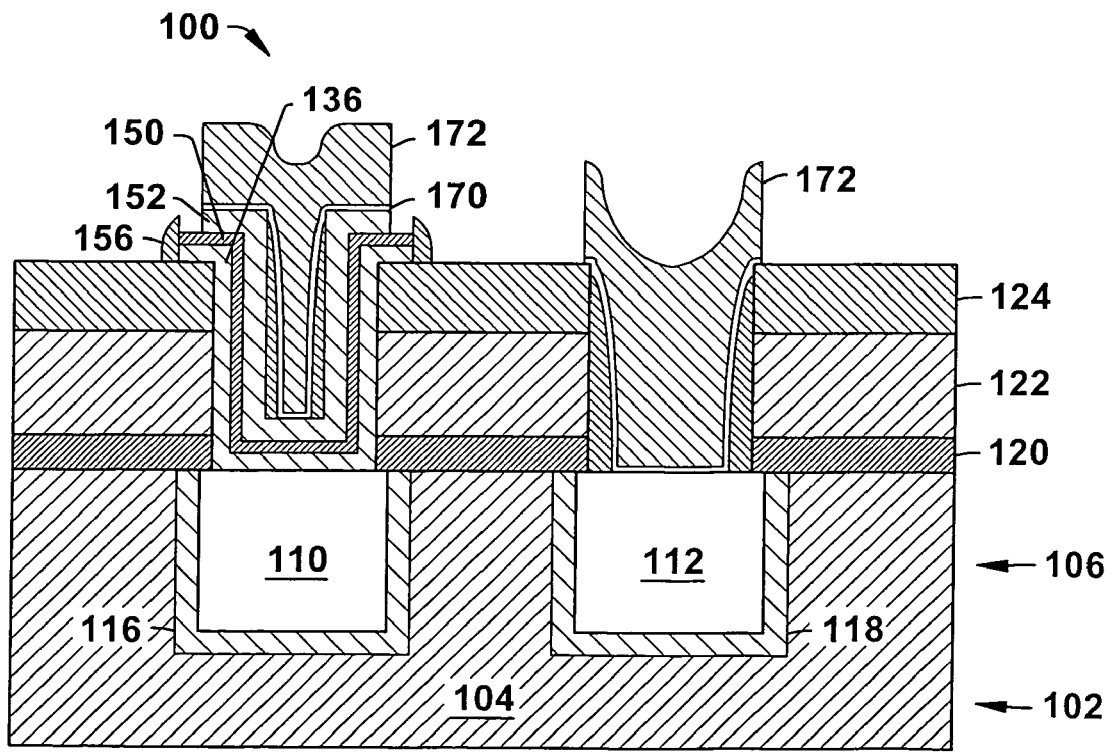

At 26, the layer of ALCAP material 172 and the layer of barrier material 170 are patterned, such as by patterning a resist 174 there-over (FIG. 10), using the resist 174 as a mask and then removing the patterned resist 174 after exposed portions of the ALCAP layer 172 and barrier layer 170 have been etched away (FIG. 11). It will be appreciated that the patterning can also be done "inside" of the sidewall spacers 156 of capacitor 100 (FIG. 12). In the illustrated example, a relatively small portion of the layer of top electrode material 152, the layer of capacitor dielectric material 150 and the layer of bottom electrode material 136 are also removed in this scenario. It will be appreciated, however, that a selective etching process may be utilized so that the layer of capacitor dielectric material 150 and the layer of bottom electrode material 136 are not removed (FIG. 13). This is discussed in greater detail below.

Figure 14:
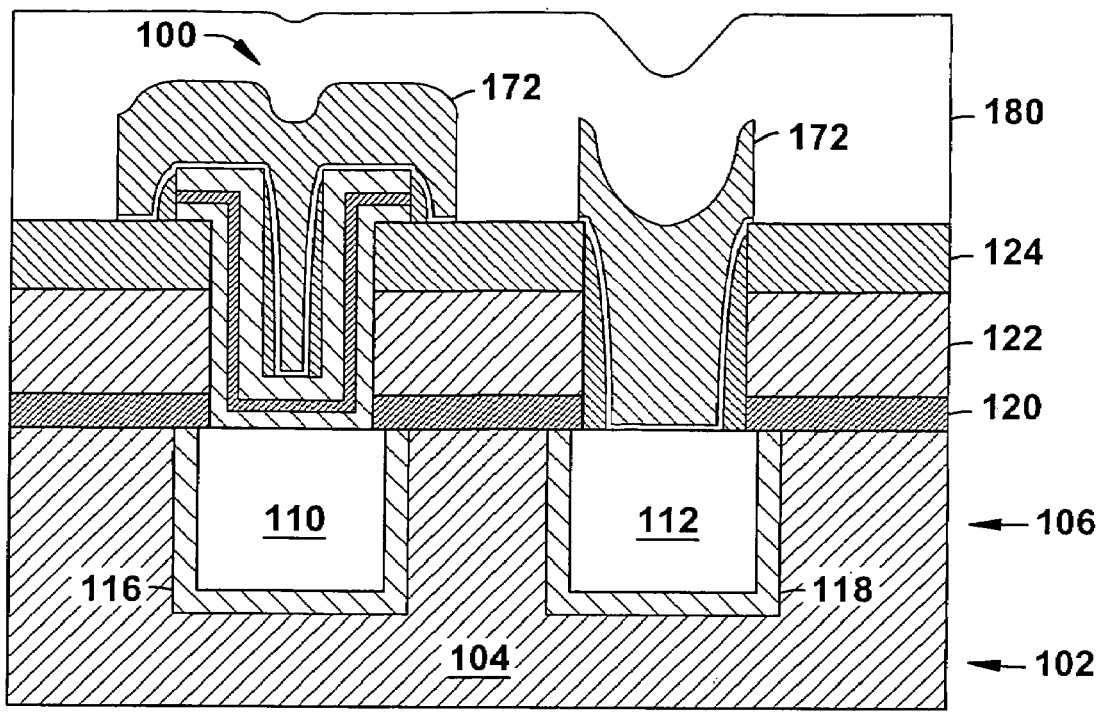
Figure 15:
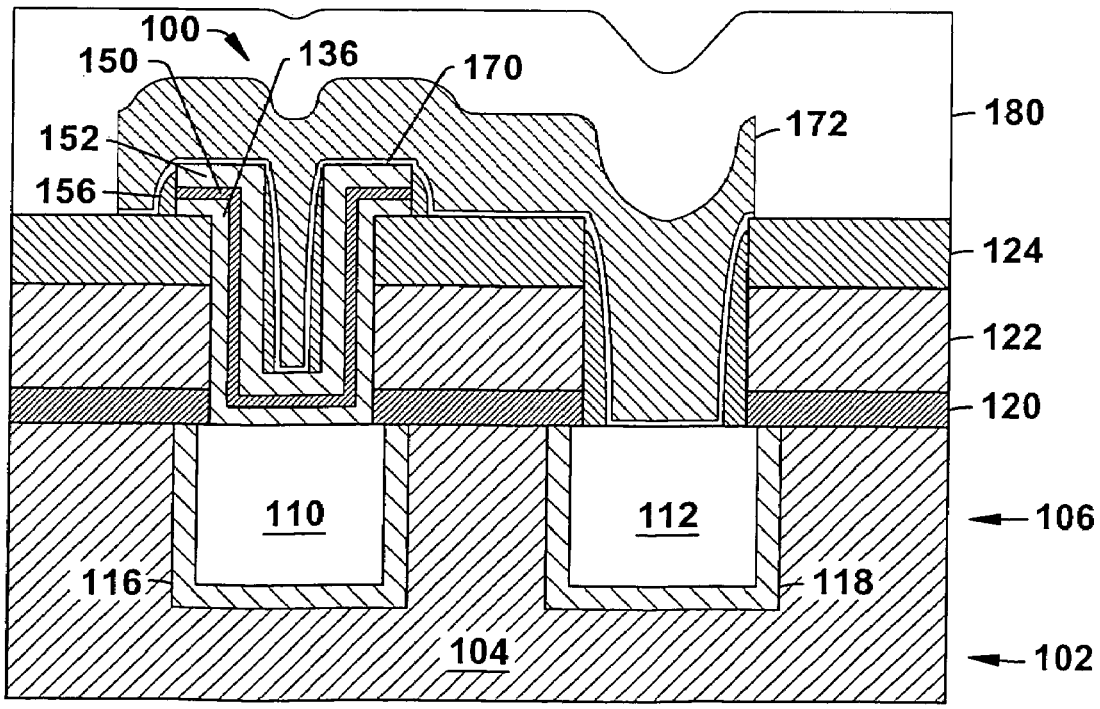
Figure 16:
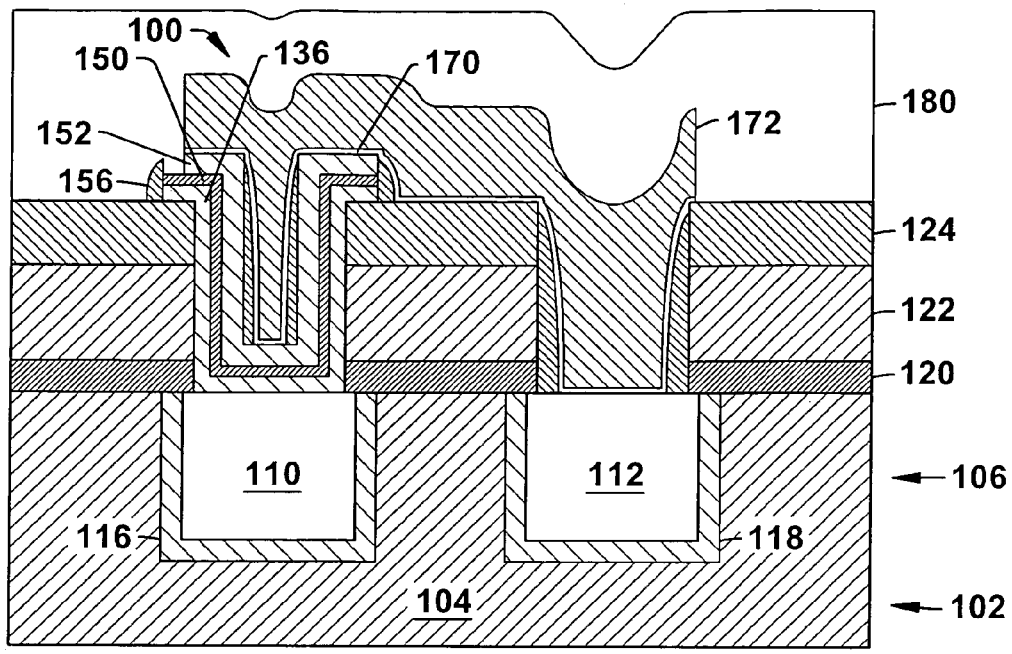

At 28, a layer of a protective capping or overcoat material 180 is formed over the capacitor 100 (FIG. 14). This layer can include an ILD material, for example, and can be formed from the same material as layer 122 and is generally formed to a thickness of less than about 100 nanometers, for example. The methodology 10 can then continue for further back end processing. It should be noted that in FIG. 11, FIG. 12, FIG. 13, and FIG. 14, the ALCAP material contacting top metal segment 110 is in fact a bond pad connection that is independent of the capacitor. Layer 110 and 112 are not drawn to scale (in relative width) in these Figs. FIG. 15 illustrates an electrical connection of the top electrode (e.g., top electrode layer 152 and/or ALCAP layer 172 of the MIM capacitor 100) to the second metal 112. For example, the top electrode layer 152 is electrically coupled to the second metal 112 via the conductive barrier layer 170 and ALCAP lap 172. FIG. 16 illustrates the same electrical connection, but where patterning (e.g., etching) of the ALCAP layer 172 is selective such that the barrier layer 170 and the top electrode layer 152 are etched away, but the capacitor dielectric layer 150 and the bottom electrode layer 136 are not etched. Additionally, the patterning performed in FIG. 16 is pulled inside the sidewall spacers 156. Again, however, the layer of top electrode material 152 is, for example, electrically coupled to the second metal 112 via the layer of barrier material 170 and the ALCAP layer 172. The thickness (e.g., on the order of about 1 micrometer) of the ALCAP layer provides a relatively low resistance conductive path.

Figure 17:
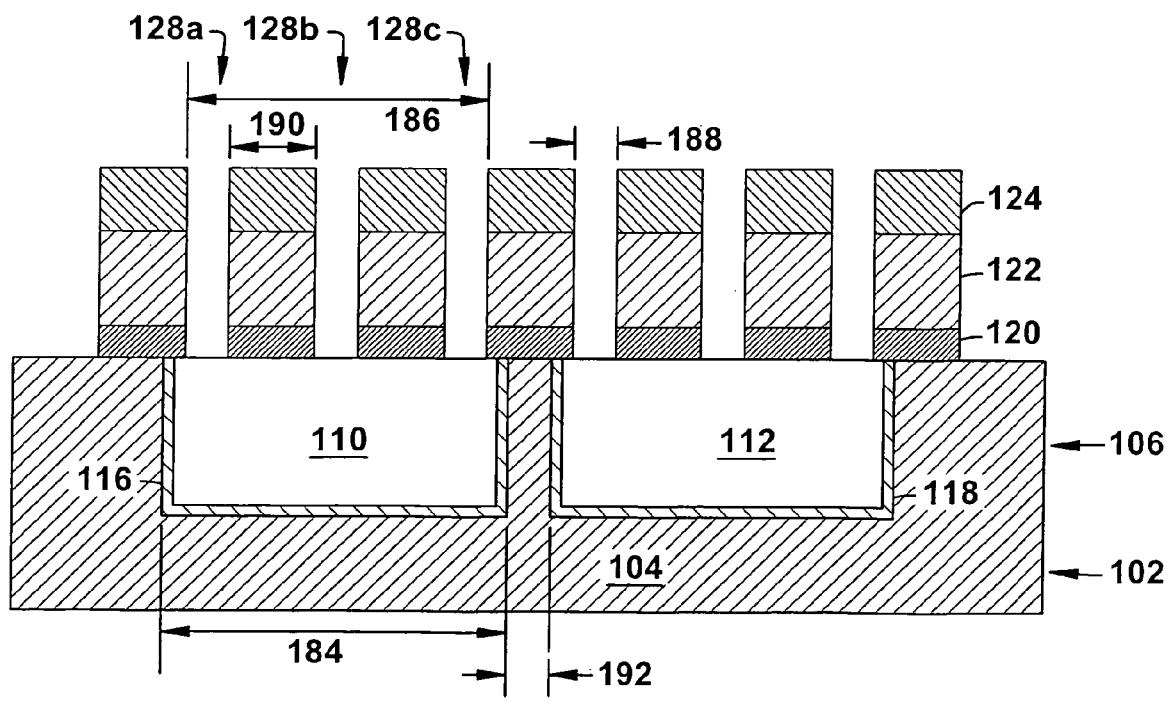
FIG. 17 is a cross-sectional illustration of a substrate depicting how multiple MIM capacitors can be formed thereon according to one or more aspects of the present invention.

It will be appreciated that the capacitance or ability of the capacitor 100 to store a charge is a function of, among other things, the surface area of the capacitor's plates, namely bottom electrode layer 136, capacitor dielectric layer 150 and top electrode layer 152. As such, the "u" shape of the capacitor, and in particular the sidewalls of the capacitor, increase the capacity of the capacitor by increasing the surface area of the capacitor's plates. FIG. 17 takes this aspect a step further by illustrating that a plurality of "u" shaped capacitors can be formed above metal 110 while keeping with one or more aspects of the present invention. In the example illustrated, three apertures 128a, 128b and 128c are formed above the first metal 110. This would produce a capacitor (not shown in completed form) with the same "area foot print" as before, but with 4 additional sidewalls to be formed above metal 110, thereby substantially increasing capacitance. In such an arrangement, the copper bottom electrode 110 and diffusion barrier 116 may have a combined width 184 of about 12.25 microns, whereas a width 186 between outermost sidewalls of the apertures may be about 11.75 micrometers, for example. The apertures 128a, 128b and 128c may themselves have respective widths 188 of about 2 micrometers, for example. Further, the apertures may be separated by a width 190 of about 2.875 micrometers, whereas the first 110 and second 112 metals may be separated by a width 192 of about 2.375 micrometers, for example. These dimensions are exemplary only given certain "slotting rules" which are needed to mitigate "copper dishing" that could occur during a CMP processes when the metal density is not optimized. Note that in this example, the capacitor is formed above bottom electrode metal 110 and 112.

Figure 18:
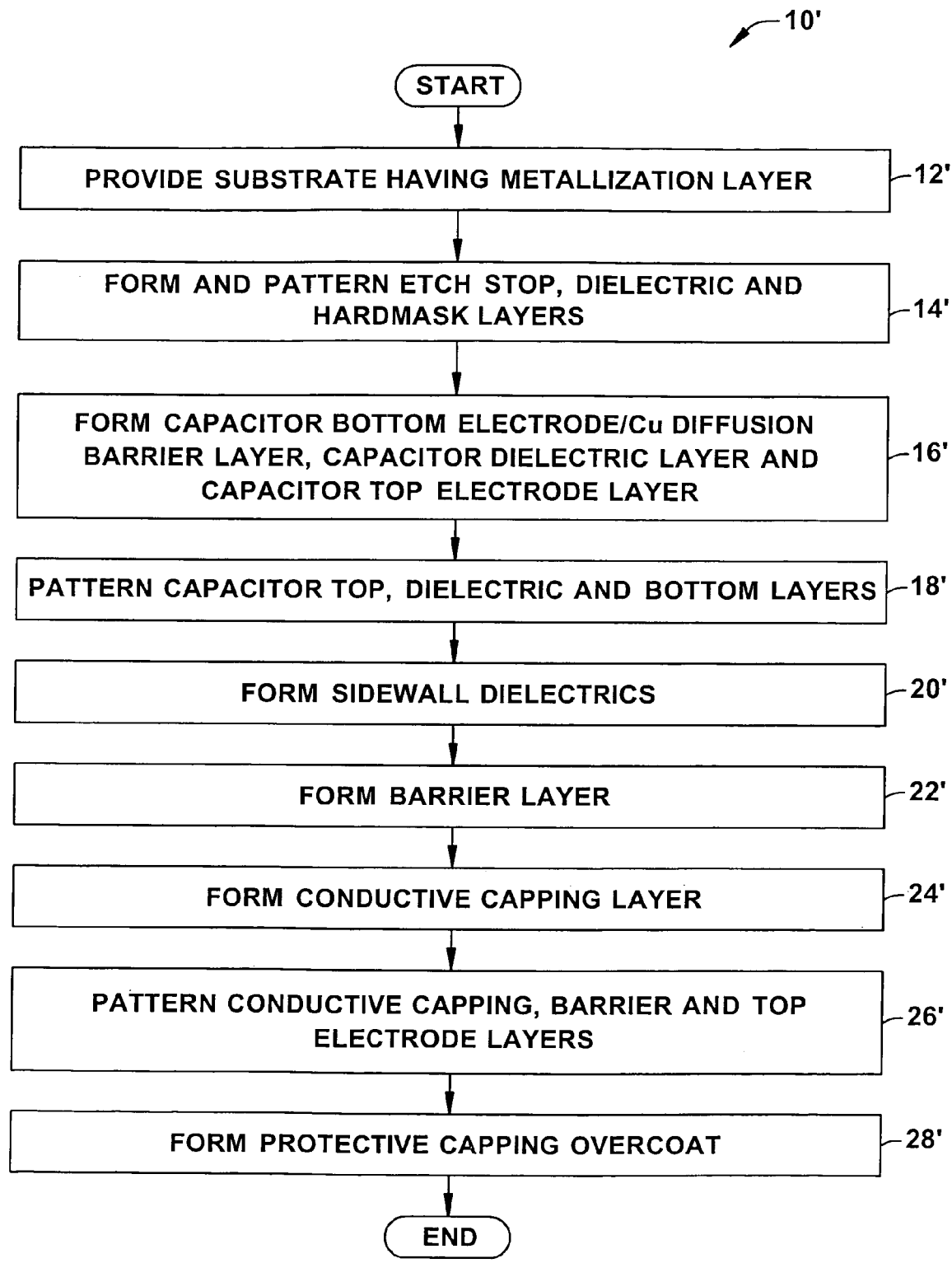
FIG. 18 is a flow diagram illustrating another exemplary methodology whereby a resistor can be formed as a MIM capacitor is fashioned in accordance with one or more aspects of the present invention.

As mentioned above with regard to FIG. 13, etching of the layer of ALCAP material may be selective so that the capacitor dielectric and bottom electrode layers are not etched when the ALCAP layer, barrier layer and top electrode layer are etched. Accordingly, FIG. 18 illustrates an exemplary methodology 10' whereby a resistor 101' can be concurrently fabricated as a MIM capacitor is fashioned in accordance with one or more aspects of the present invention. Many of the acts of methodology 10' are similar to those of methodology 10 and thus are addressed with the same reference characters, but having a prime " ' " notation. Similarly, layers, elements, etc. within the corresponding cross sectional FIGS. are similar to those referred to with regard to methodology 10 and thus are also labeled with the same reference characters, but also having a prime " ' " notation. For purposes of brevity where the same layers, features, elements, acts, etc. of methodology 10 are reproduced in methodology 10' and the accompanying FIGS., they are not elaborated upon again.

Figure 19:
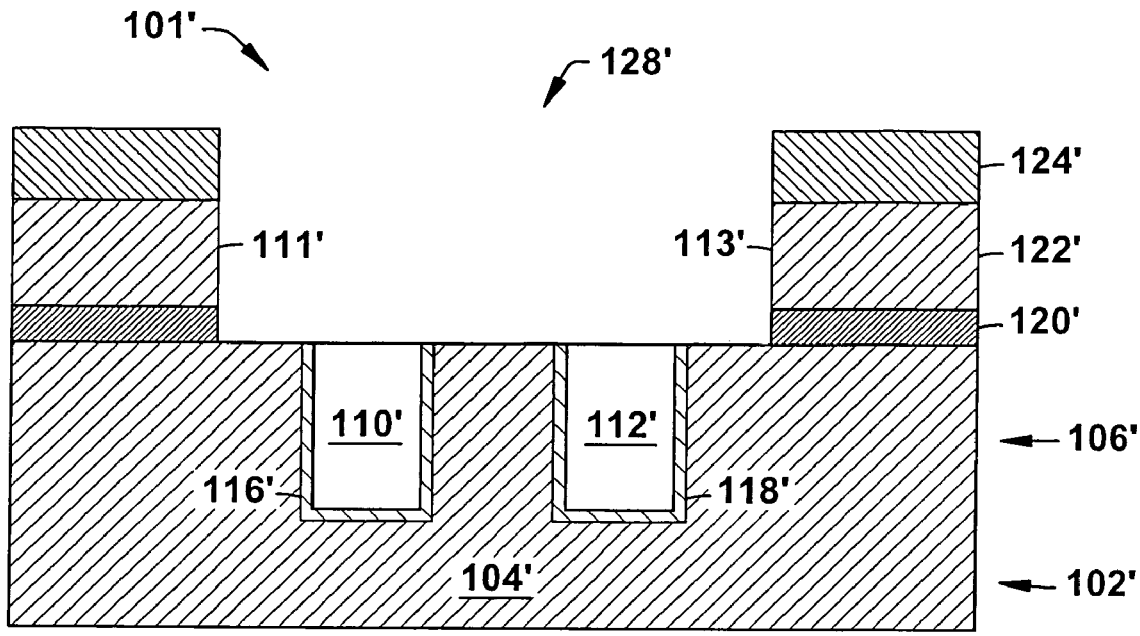
FIGS. 19-24 are cross-sectional illustrations of a resistor being formed according to one or more aspects of the present invention, such as that set forth in FIG. 18.

Initially, a substrate 102' is provided that has been processed through formation of a topmost metallization layer 106' at 12' (FIG. 19). A layer of an etch stop material 120', a layer of a dielectric material 122' and a layer of a hardmask material 124' are sequentially formed over the substrate 102' and patterned (e.g., etched) at 14' (FIG. 19) to form an aperture 128' therein that reveals first 110' and second 112' metals. It will be appreciated, and as can be seen in the FIGS., that resistors 101' fashioned in accordance with one or more aspects of the present invention are formed at slightly different locations than capacitors, but that they are formed from the same layer thickness of layers 120', 122' and 124' thus streamlining the process.

It will be appreciated that a width of aperture 128' is large enough to independently accommodate metals 110' and 112'. Specifically, the spacing between the left sidewall 111' of aperture 128' and the left side of barrier 116' is sufficient to accommodate all conductive sidewall material that may eventually form on sidewall 111' so that said material does not come into electrical contact with 116' or 110'. The same is true to the right of barrier 118' so that conductive materials on sidewall 113' do not come into contact with 112' or 118'. Metals 110' and 112' will form the two "heads" or low resistance contact points of the resistor (as illustrated below).

Figure 20:
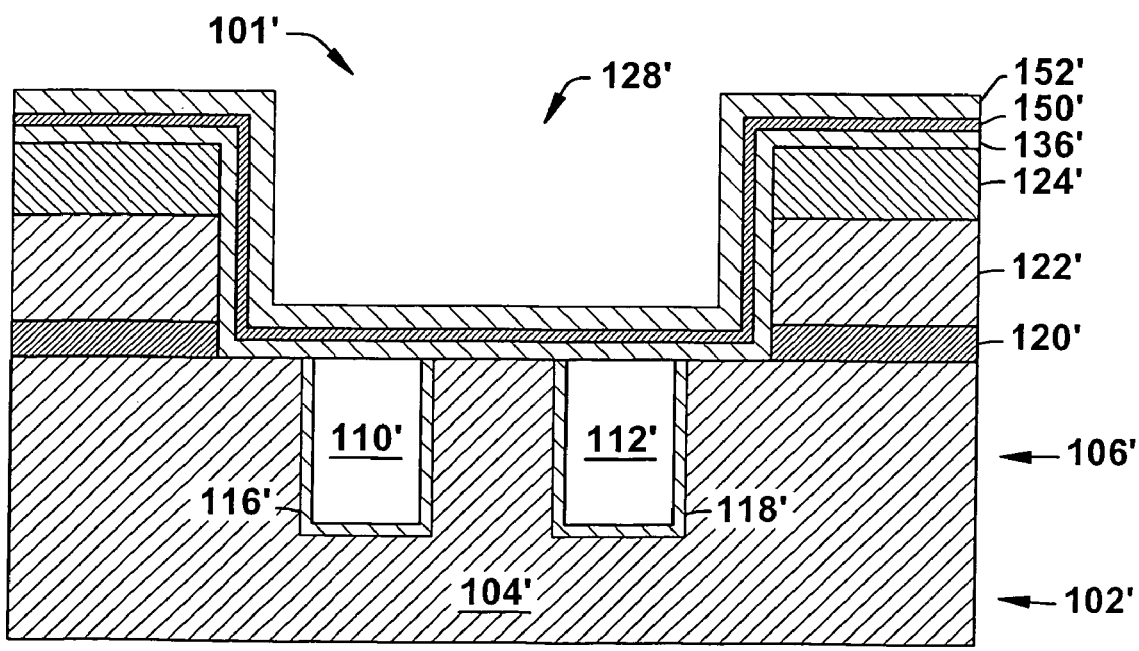
Figure 21:
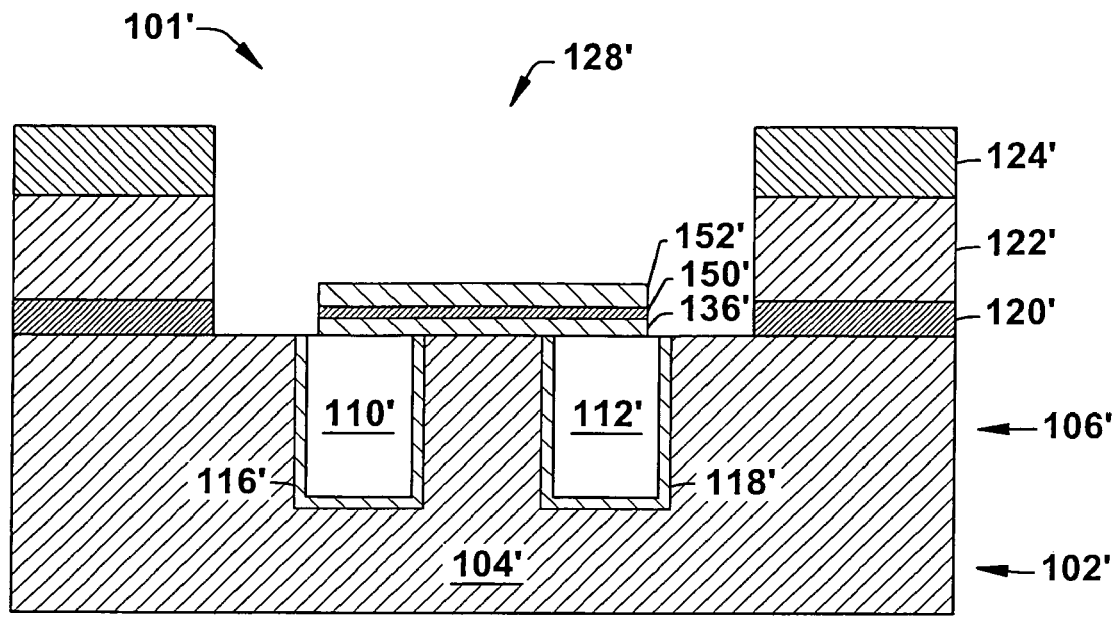
Figure 22:
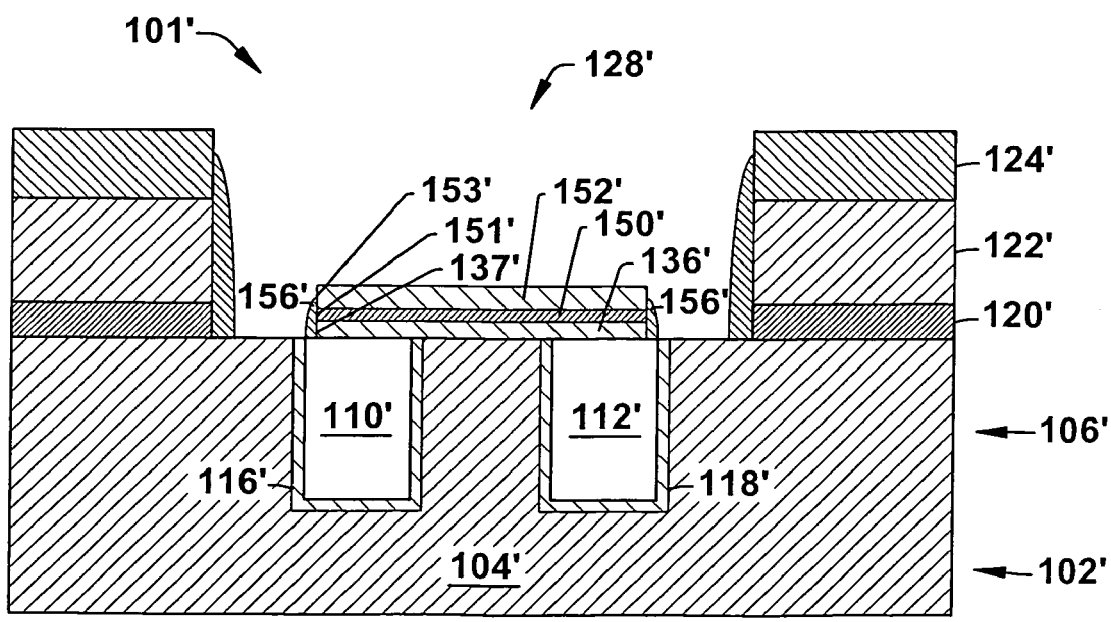

Next, at 16' a layer of bottom electrode/copper diffusion barrier material 136' is formed (e.g., deposited) over the layer of hardmask material 124' and down into the aperture 128' over the first and second metals 110', 112', with a layer of capacitor dielectric material 150' and a layer of top electrode material 152' sequentially formed over the layer of bottom electrode material 136' (FIG. 20). At 18, the capacitor top 152', dielectric 150' and bottom 136' layers are patterned, such as via lithographic and/or etching techniques (FIG. 21). In this embodiment, the stack etch of layer 152', 150', and 136' will more than likely be anisotropic, so sidewall aspects of these layers will be left on the sidewalls of aperture 128'. As long as the spacing from the sidewalls 111', 113' of aperture 128' to metals 116' and 1118' is large enough, these (and other subsequent) sidewall layers will be electrically isolated from the resistor. Such sidewall aspects of layers 136', 150', and 152' are not depicted in FIG. 21 and subsequent figures describing resistor formation for purposes of simplicity. At 20, sidewall spacers 156' are formed adjacent to sidewalls 137', 151' and 153' of the capacitor top 152', dielectric 150' and bottom 136' layers, respectively, as well as other places (FIG. 22).

Figure 23:
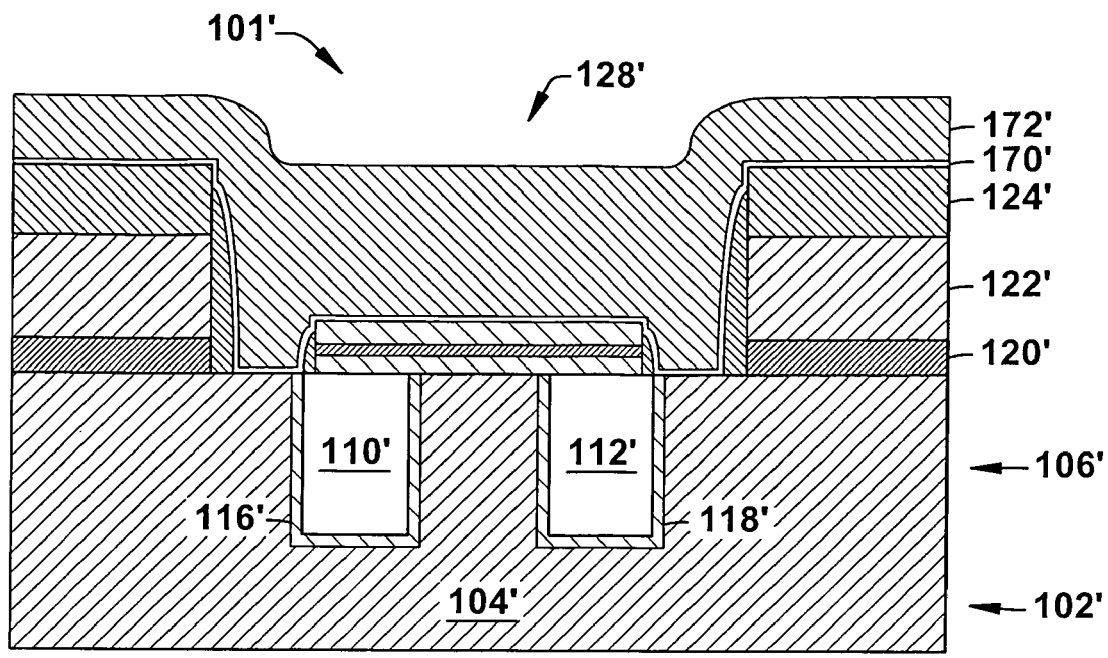
Figure 24:
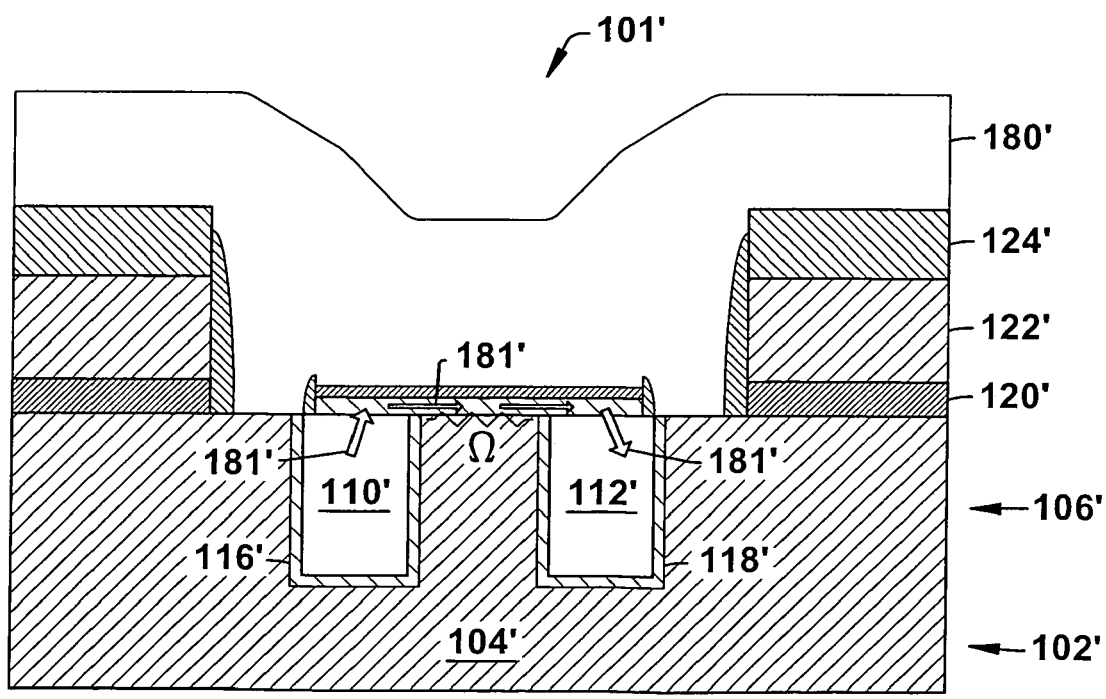

A layer of barrier material 170' is then formed over the hardmask layer 124' and down into the aperture 128' at 22 (FIG. 23). The barrier layer 170' conforms over the sidewall spacers 156' and patterned layers 136', 150' and 152', and a layer of ALCAP material 172' is then formed over the barrier layer 170' at 24 (FIG. 23). At 26, the conductive capping ALCAP layer 172', barrier layer 170' and top electrode layer 152' are patterned (and completely removed in the illustrated example, i.e., no ALCAP resist remains to cover other layers in FIG. 23), such as via lithographic and/or etching techniques (FIG. 24). The patterning (e.g., etching) stops, however, on the layer of capacitor dielectric material 150', and a final layer of a protective capping or overcoat material 180' is then formed at 28' (FIG. 24). Note that sidewall aspects of the diffusion barrier and ALCAP material would remain on vertical sidewalls after an anisotropic etch. These layers are not, however, shown in FIG. 24. The methodology 10' can subsequently continue on for further back end processing.

With reference to FIG. 24, and in particular the direction(s) indicated by arrows 181', it will be appreciated that a conductive/resistive pathway (and thus resistor 101') exists along/between metal 110', bottom electrode layer 136' where it does not touch metals 110' or 112', and metal 112'. It will also be appreciated, however, that current can flow in the opposite direction (to arrows 181') as well. Further, resistor values/characteristics can be tailored, based upon factors such as the materials utilized within these layers and the dimensions of these materials at respective interfaces.

Figure 25:
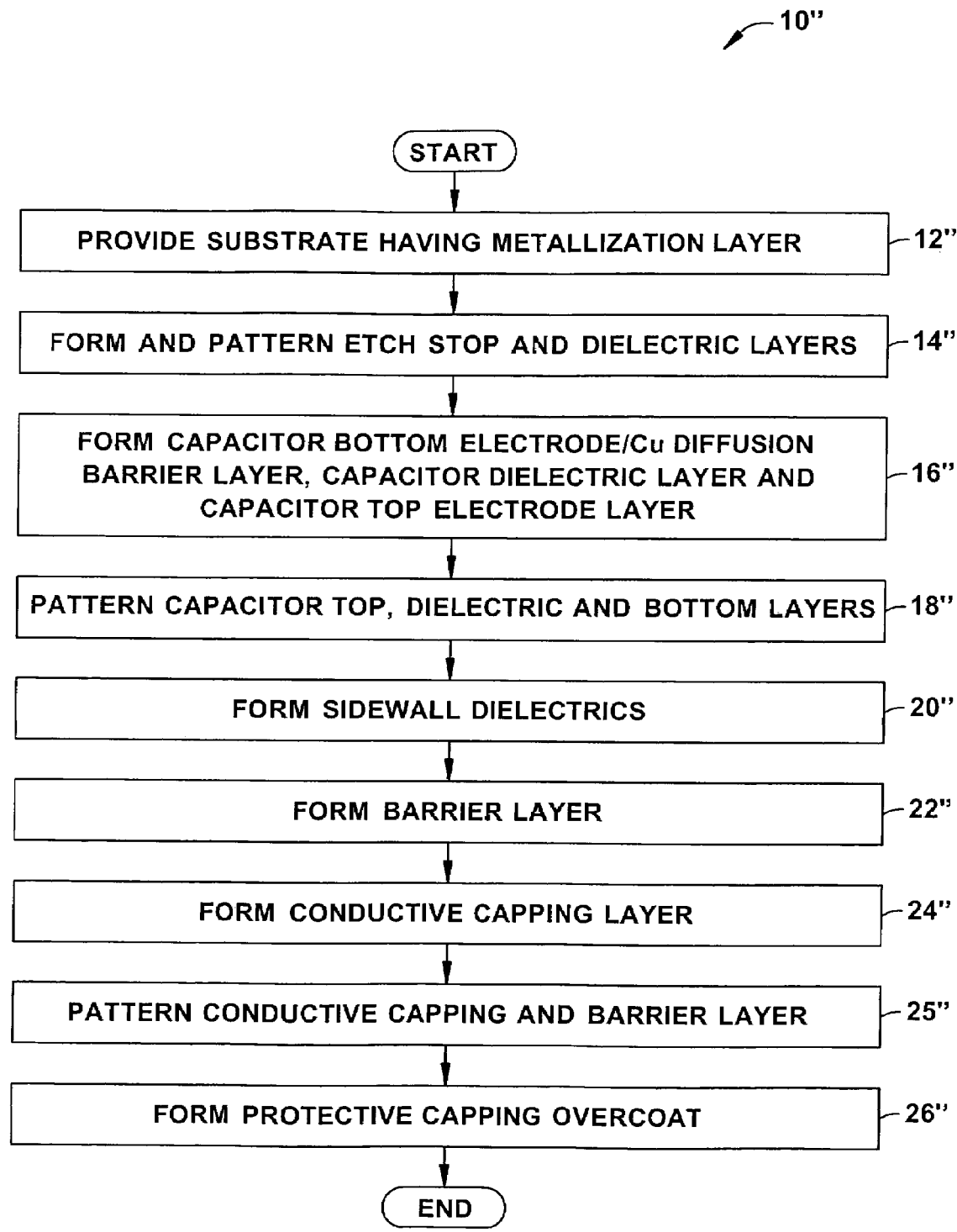
FIG. 25 is a flow diagram illustrating an exemplary methodology for forming a two dimensional MIM (metal insulator metal) capacitor in accordance with one or more aspects of the present invention.

Turning to FIG. 25, another an exemplary methodology 10" is illustrated for forming a MIM (metal insulator metal) capacitor according to one or more aspects of the present invention. This methodology 10" and the accompanying cross sectional FIGS. illustrate the formation of a two dimensional MIM capacitor, rather than a "u" shaped or three dimensional capacitor as described above. This time, a double prime """ notation is utilized for similar acts, features, elements, layers, etc.

Figure 26:
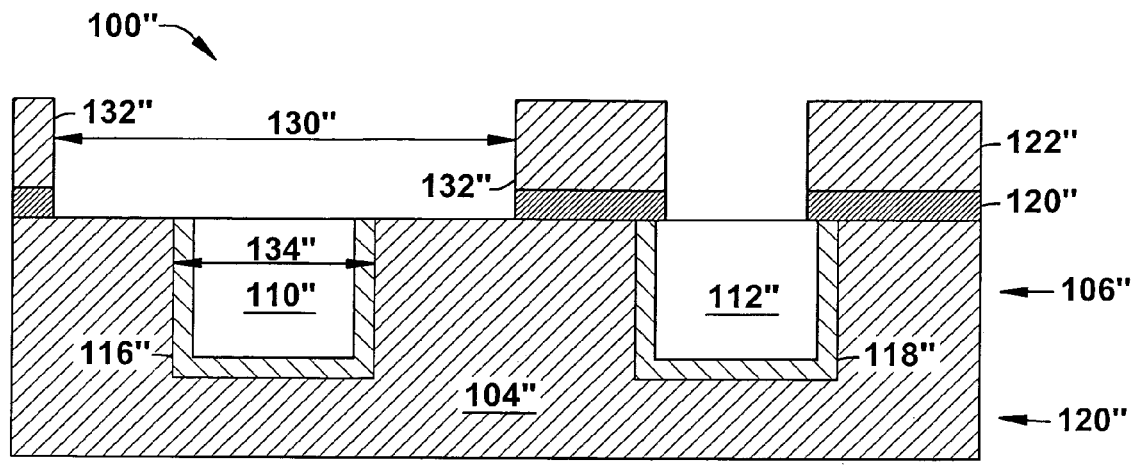
FIGS. 26-31 are cross-sectional illustrations of a MIM capacitor being formed according to one or more aspects of the present invention, such as that set forth in FIG. 25.
Figure 27:
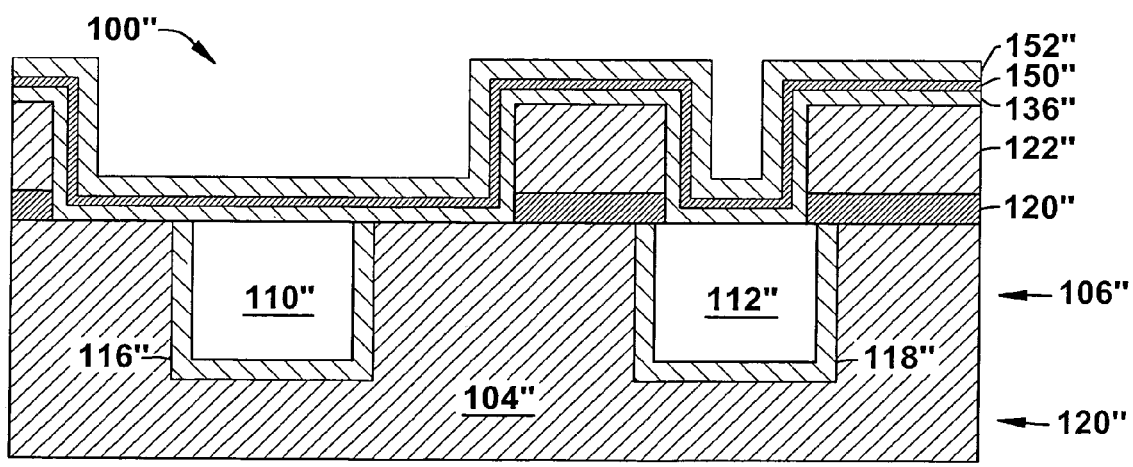

The methodology 10" begins at 12" wherein a substrate 102" is provided that has been processed through formation of a topmost metallization layer 106' at 12' (FIG. 26). A layer of an etch stop material 120" and a layer of a dielectric material 122" are sequentially formed over the substrate 102" and patterned (e.g., etched) at 14" forming apertures 128", 129" therein revealing first 110" and second 112" metals (FIG. 26). It can be seen that a width 130" of the aperture 128" between sidewalls 132" is generally greater than a width 134" of the first metal 110" and surrounding diffusion barrier 116". At 16 a layer of bottom electrode/copper diffusion barrier material 136" is formed over the layer of dielectric material 122" and down into the apertures 128", 129" over the first and second metals 110", 112", with a layer of capacitor dielectric material 150" and a layer of top electrode material 152" sequentially formed over the layer of bottom electrode material 136" (FIG. 27).

Figure 28:
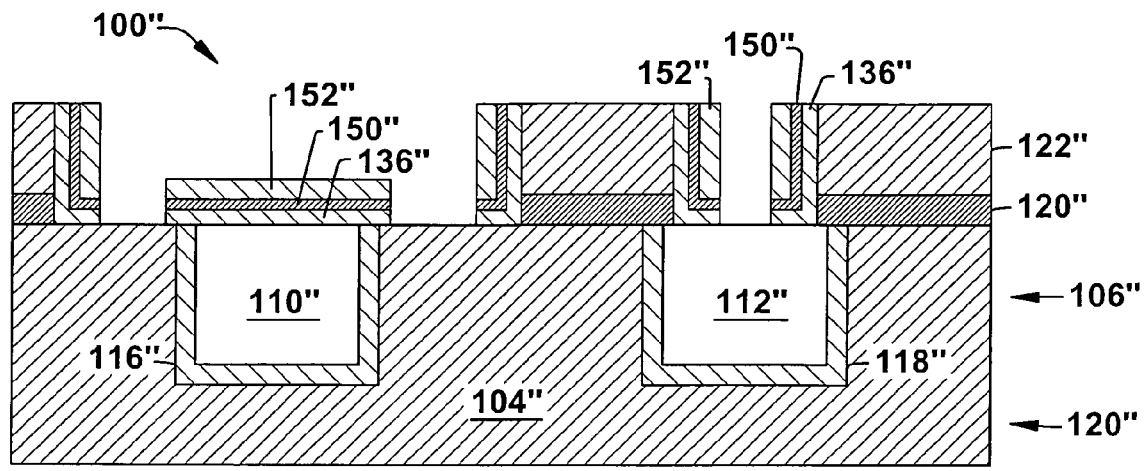
Figure 29:
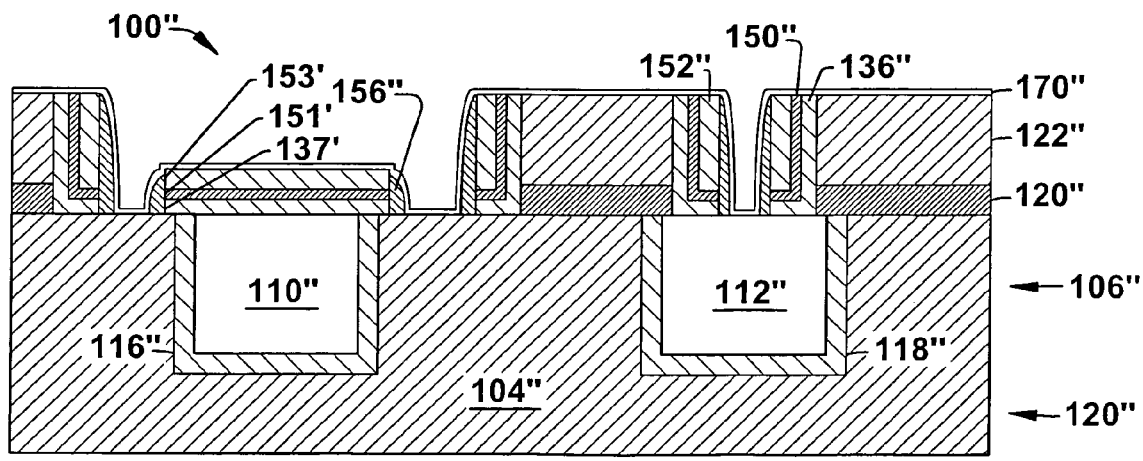
Figure 30:
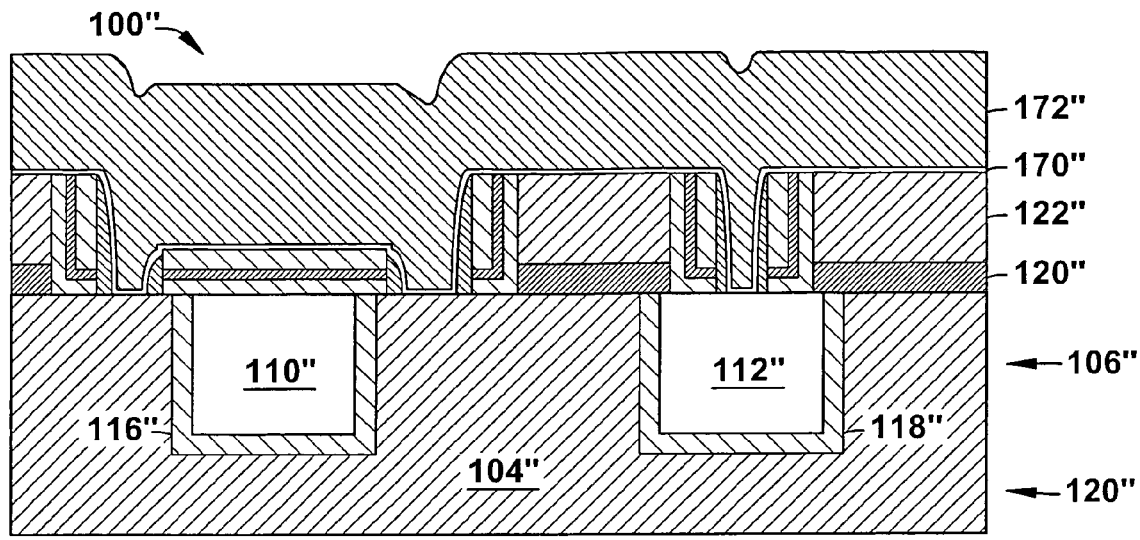
Figure 31:
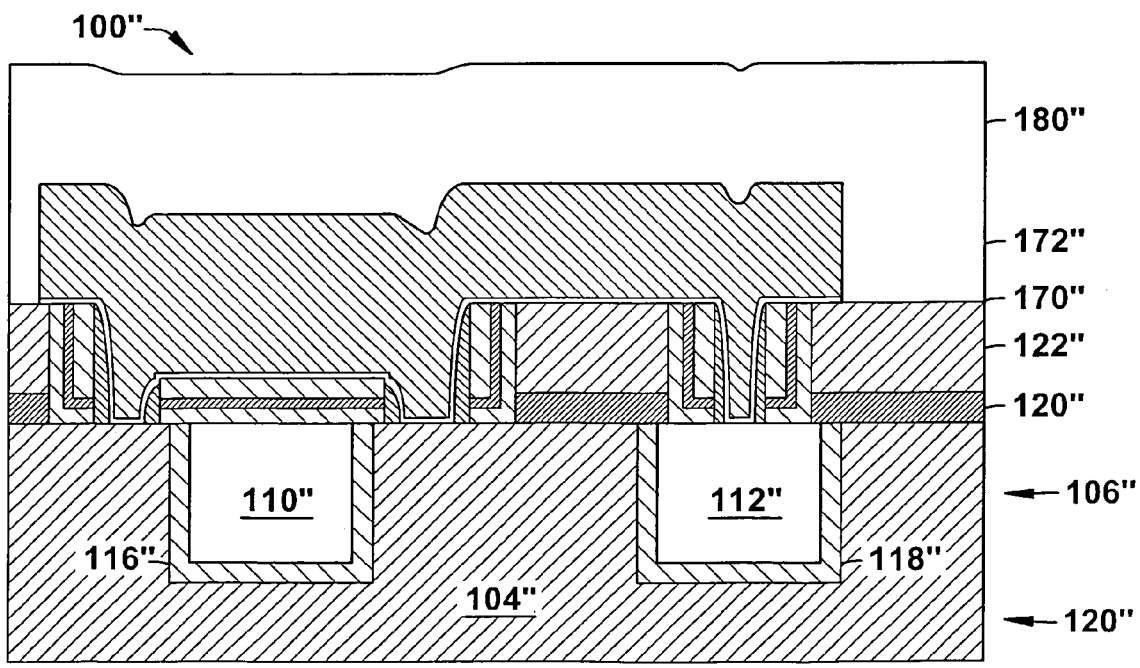
Figure 32:
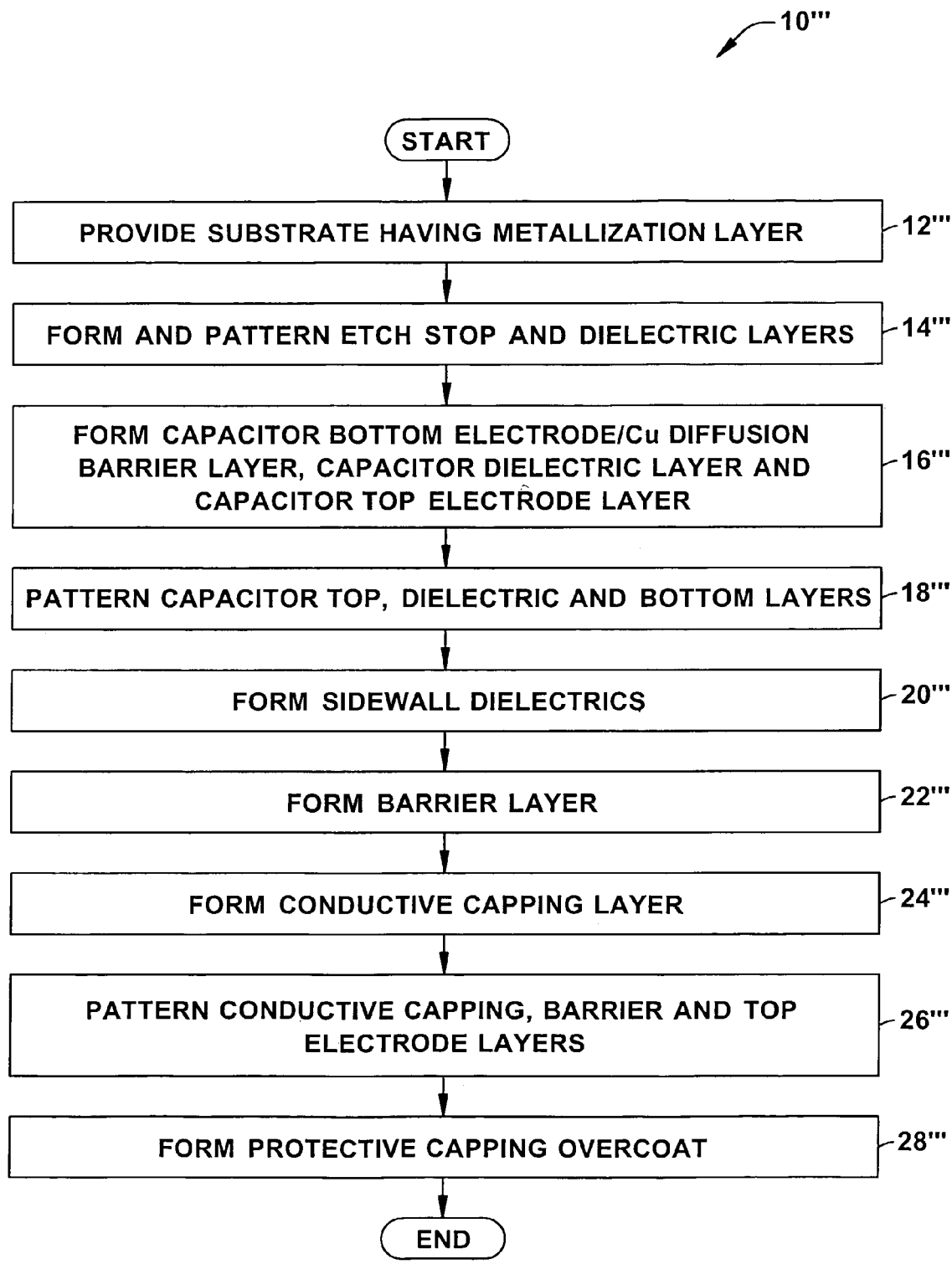
FIG. 32 is a flow diagram illustrating another exemplary methodology whereby a resistor can be formed as a MIM capacitor is fashioned in accordance with one or more aspects of the present invention.
Figure 33:
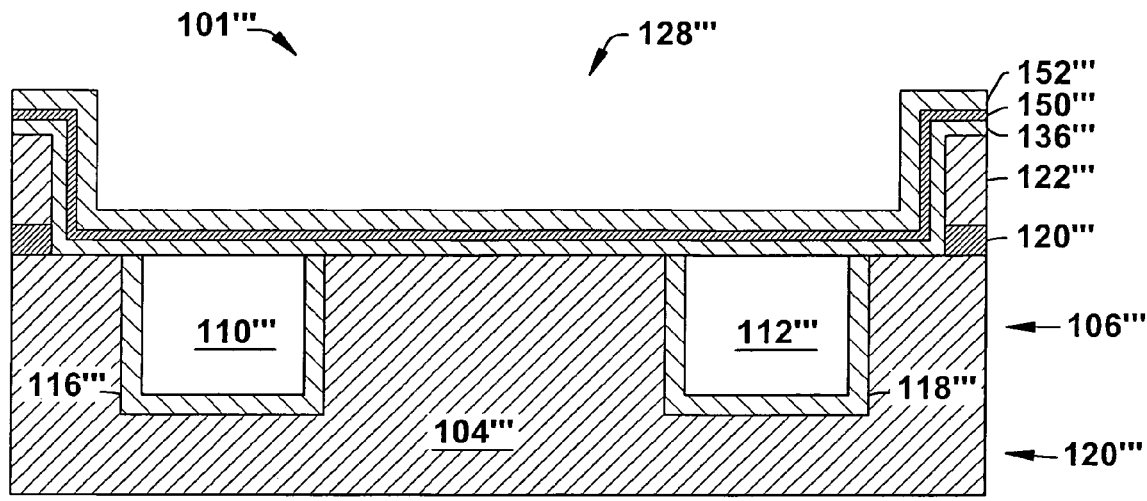
FIGS. 33-36 are cross-sectional illustrations of a resistor being formed according to one or more aspects of the present invention, such as that set forth in FIG. 32.

At 18", the capacitor top 152", dielectric 150" and bottom 136" layers are patterned, such as via lithographic and/or etching techniques (FIG. 28). It will be appreciated that these layers may be patterned with isotropic or non-directional techniques to remove sidewall aspects of layers 152", 150" and 136" from the trenches. However, it will be assumed in this embodiment that an anisotropic etch is used and thus, sidewall aspect layers remains (as shown). At 20", sidewall spacers 156" are formed adjacent to sidewalls 137", 151" and 153" of the capacitor top 152", dielectric 150" and bottom 136" layers, respectively, as well as other places (FIG. 29). It will be appreciated that these spacers 156" extend above the dielectric layer 150", but not above the top electrode layer 152". At 22" a layer of barrier material 170" is then formed, including down into the aperture 128" (FIG. 29). A layer of ALCAP material 172" is then formed over the barrier layer 170" at 24" (FIG. 30). As with the non-planar case, at 25" the ALCAP layer is then patterned and etched. At 26", a layer of a protective capping or overcoat material 180" is then formed over the ALCAP layer 172" (FIG. 31). The methodology 10" can then continue on for further back end processing Turning to FIG. 32 a methodology 10''' is illustrated for concurrently forming a resistor while forming a two dimensional MIM capacitor in accordance with one or more aspects of the present invention. In this methodology and the accompanying FIGS., a triple prime """ notation is utilized. The methodology 10''' begins at 12''' wherein a substrate 102''' is provided that has been processed through formation of a topmost metallization layer 106''' (FIG. 33). A layer of an etch stop material 120''' and a layer of a dielectric material 122''' are sequentially formed over the substrate 102''' and patterned (e.g., etched) at 14''' (FIG. 33) to form an aperture 128''' therein revealing first 110''' and second 112''' metals.

Figure 34:
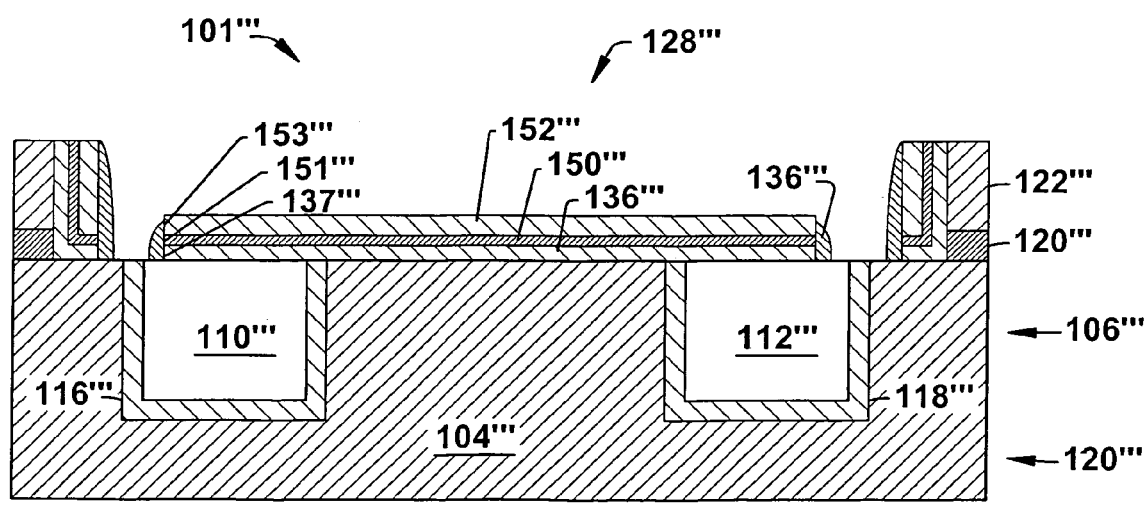

At 16''' a layer of bottom electrode/copper diffusion barrier material 136''' is formed over the layer of dielectric material 122''' and down into the aperture 128''' over the first and second metals 110''', 112''', with a layer of capacitor dielectric material 150''' and a layer of top electrode material 152''' sequentially formed over the layer of bottom electrode material 136''' (FIG. 33). At 18''', the capacitor top electrode 152''', dielectric 150''' and bottom electrode 136''' layers are patterned, such as via lithographic and/or etching techniques (FIG. 34). At 20''', sidewall spacers 156''' are formed adjacent to sidewalls 137''', 151''' and 153''' of the capacitor top electrode 152''', dielectric 150''' and bottom electrode 136''' layers, respectively, among other places (FIG. 34).

Figure 35:
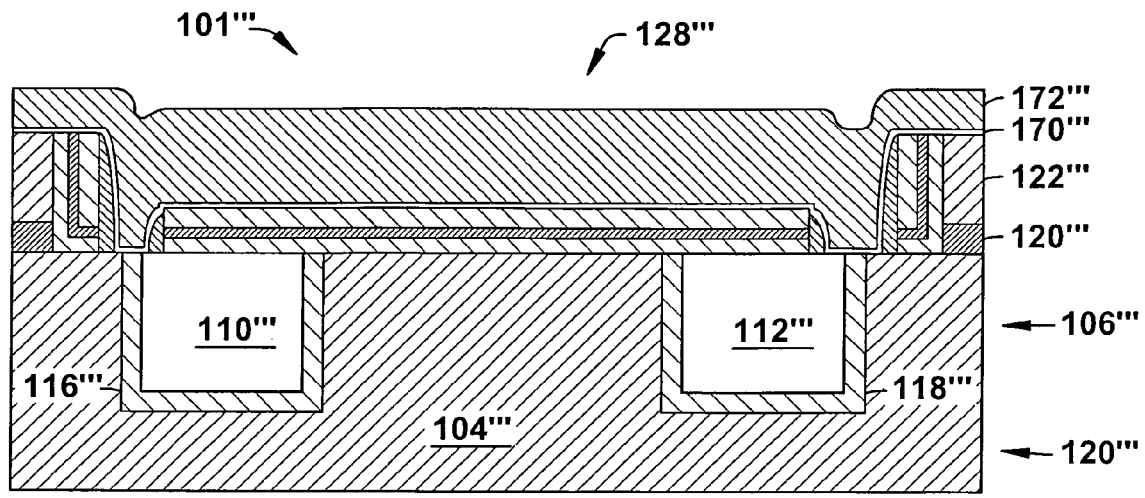
Figure 36:
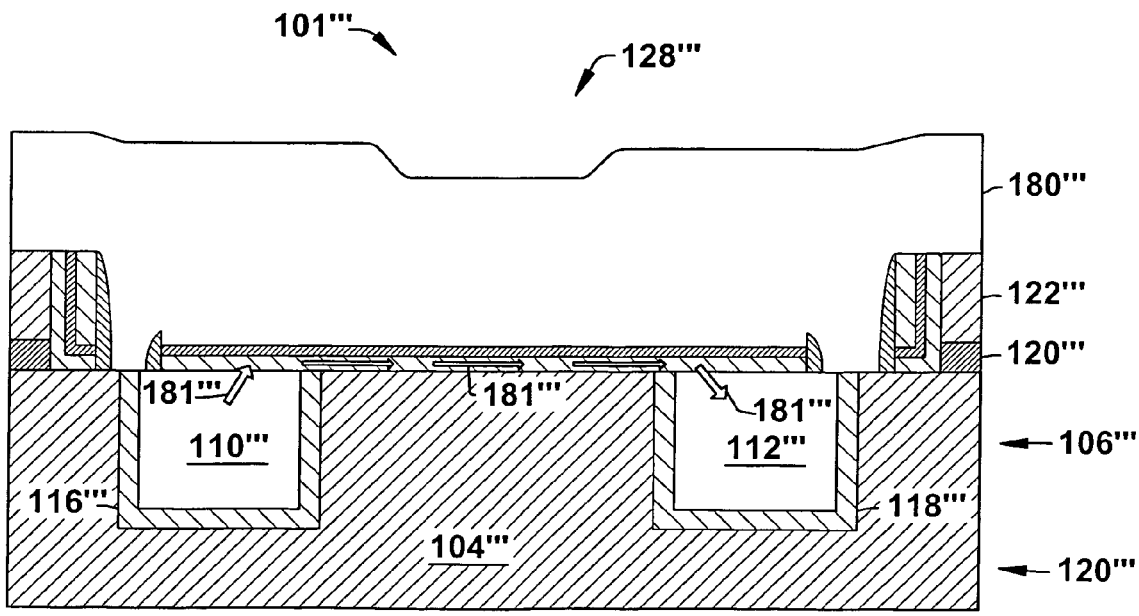

A layer of barrier material 170''' is then formed over the dielectric layer 122''' and down into the aperture 128''' at 22 (FIG. 35). The barrier layer 170''' conforms over the sidewall spacers 156''' and patterned layers 136''', 150''' and 152''', and a layer of ALCAP material 172''' is then formed over the barrier layer 170''' at 24''' (FIG. 35). At 26''', the conductive capping ALCAP layer 172''', barrier layer 170''' and top electrode layer 152''' are patterned (and completely removed in this example), such as via lithographic and/or etching techniques (FIG. 36). The patterning stops on the layer of capacitor dielectric material 150''' to facilitate forming the resistor 101''' having conductive path 181'''. Note that the sidewall layers of ALCAP barrier and ALCAP material that would remain on any vertical sidewall after this etch are not illustrated in FIG. 36. A final layer of a protective capping or overcoat material 180''' is then formed at 28''' (FIG. 36). The methodology 10''' can subsequently continue on for further back end processing.

It will be appreciated that while reference is made throughout this document to exemplary structures in discussing aspects of methodologies described herein (e.g., those structures presented in FIGS. 2-17 while discussing the methodology set forth in FIG. 1, those structures presented in FIGS. 19-24 while discussing the methodology set forth in FIG. 18, those structures presented in FIGS. 26-31 while discussing the methodology set forth in FIG. 25 and those structures presented in FIGS. 33-36 while discussing the methodology set forth in FIG. 32), that those methodologies are not to be limited by the corresponding structures presented. Rather, the methodologies (and structures) are to be considered independent of one another and able to stand alone and be practiced without regard to any of the particular aspects depicted in the FIGS.

It will also be appreciated that copper diffusion barriers, including those disclosed herein, are typically formed using conductive compounds of transition metals, such as tantalum, tungsten and titanium alone or in combination with their respective nitrides, carbonitrides, silicon nitrides and/or silicon carbonitrides (e.g., Ta, TaN, TaSiN, titanium nitride, tungsten nitride, silicon nitride, silicon oxynitride, silicon carbide). It will be appreciated, however, that any and all barrier materials with sufficient Cu barrier properties are contemplated as falling within the scope of the present invention.

Further, from time to time throughout this specification and the claims that follow, one or more layers or structures may be described as being or containing a substance such as "tungsten", "copper", "silicon nitride", etc. These description are to be understood in context and as they are used in the semiconductor manufacturing industry. For example, in the semiconductor industry, when a metallization layer is described as containing copper, it is understood that the metal of the layer comprises pure copper as a principle component, but the pure copper may be, and typically is, alloyed, doped, or otherwise impure. As another example, silicon nitride may be a silicon rich silicon nitride or an oxygen rich silicon nitride. Silicon nitride may contain some oxygen, but not so much that the material's dielectric constant is substantially different from that of high purity stoichiometric silicon nitride.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example.

What is claimed is:

1. A method of forming a MIM (metal insulator metal) capacitor, comprising:

forming a sidewall spacer against an edge of a layer of bottom electrode material, an edge of a layer of capacitor dielectric material and at least some of an edge of a layer of top electrode material, wherein at least some of the layer of bottom electrode material is formed over a first metal formed within a topmost metallization layer on a substrate, the layer of capacitor dielectric material is formed over the layer of bottom electrode material and the layer of top electrode material is formed over the layer of capacitor dielectric material;

forming a layer of barrier material over the layer of top electrode material and the sidewall spacer;

forming a layer of aluminum capping (ALCAP) material over the layer of barrier material, wherein the layer of aluminum capping material comprises at least some of a top electrode of the MIM capacitor and the first metal comprises at least some of a bottom electrode of the MIM capacitor; and wherein at least some of the layer of bottom electrode material, at least some of the capacitor dielectric material and at least some of the top electrode material are formed down into an aperture defined over the first metal, wherein the respective edges of the layer of bottom electrode material, capacitor dielectric material and top electrode material do not reside within the aperture nor does the sidewall spacer, and wherein a width of the aperture is less than a width of the first metal.

2. The method of claim 1, further comprising:
    patterning the layer of ALCAP material, the layer of barrier material and the layer of top electrode material.

3. The method of claim 2, further comprising:
    forming a layer of protective overcoat material over the layer of ALCAP material.

4. The method of claim 2, further comprising:
    patterning the layer of capacitor dielectric material and the layer of bottom electrode material.

5. The method of claim 1, wherein the edges of the layer of bottom electrode material, capacitor dielectric material, and top electrode material extend past a side of the first metal.

6. The method of claim 1, wherein at least one of the layer of bottom electrode material, top electrode material and barrier material comprise at least one of tantalum, tungsten, titanium, tantalum nitride, tantalum silicon nitride, titanium nitride, tungsten nitride, silicon nitride, silicon oxynitride and silicon carbide.

7. The method of claim 1, wherein a thickness of the sidewall spacer is greater than a thickness of the layer of bottom electrode material plus a thickness of the layer of capacitor dielectric material, but is less than the thickness of the layer of bottom electrode material plus the thickness of the layer of capacitor dielectric material plus a thickness of the layer of top electrode material.

8. The method of claim 7, wherein the layer of bottom electrode material has a thickness of between about 100 to about 400 angstroms, the layer of capacitor dielectric material has a thickness of less than about 600 angstroms, the layer of top electrode material has a thickness of between about 400 to about 900 angstroms and the layer of barrier material is formed to a thickness of less than about 500 angstroms.

9. The method of claim 1, wherein at least one of the layer of capacitor dielectric material and the sidewall spacer comprises at least one of nitride based materials, oxide based materials, spin-on-glasses (SOGs), organic materials, quasi-organic materials, polysilsesquioxanes, fluorinated silica glasses (FSGs), fluorinated polyarylene ethers and organo-silicate-glasses (OSGs).

10. The method of claim 1, wherein before forming the layer of barrier material and the layer ALCAP material, the method further comprises:

forming the layer of bottom electrode material, the layer of capacitor dielectric material and the layer of top electrode material;

patterning the layer of top electrode material, the layer of capacitor dielectric material and the layer of bottom electrode material;

forming a layer of sidewall spacer material; and patterning the layer of sidewall spacer material to form the sidewall spacer.

11. The method of claim 10, wherein the layer of capacitor dielectric material is formed via plasma enhanced chemical vapor deposition (PECVD).

12. The method of claim 11, wherein the layer of capacitor dielectric material is formed at a temperature of less than about 400 degrees Celsius.

13. The method of claim 1, wherein the first metal comprises copper, and wherein first and second sides and a bottom of the first metal is surrounded by a layer of copper diffusion material comprising at least one of tantalum, tungsten, titanium, tantalum nitride, tantalum silicon nitride, titanium nitride, tungsten nitride, silicon nitride, silicon oxynitride and silicon carbide.

14. The method of claim 1, wherein the aperture is formed within a layer of an etch stop material formed over the substrate, a layer of a dielectric material formed over the layer of etch stop material and a layer of a hardmask material formed over the layer of dielectric material.

15. The method of claim 14, wherein the layer of etch stop material has a thickness of between about 300 to about 800 angstroms, the layer of dielectric material has a thickness of between about 3000 to about 5000 angstroms and the layer hardmask material has a thickness of between about 300 to about 2000 angstroms.

16. The method of claim 14, wherein the layer of etch stop material comprises at least one of silicon nitride, silicon oxynitride, silicon oxide, phospho-silicate glass (PSG), polyimide and other organic polymers, the layer of hardmask material comprises at least one of silicon oxynitride and silicon carbide and the layer of dielectric material comprises at least one of nitride based materials, spin-on-glasses (SOGs), organic materials, quasi-organic materials, polysilsesquioxanes, fluorinated silica glasses (FSGs), fluorinated polyarylene ethers and organo-silicate-glasses (OSGs).

17. A method of forming a resistor while forming a MIM (metal insulator metal) capacitor, comprising:
   forming a sidewall spacer against an edge of a layer of bottom electrode material, an edge of a layer of capacitor dielectric material and at least some of an edge of a layer of top electrode material, wherein at least some of the layer of bottom electrode material is formed over a first metal formed within a topmost metallization layer on a substrate, the layer of capacitor dielectric material is formed over the layer of bottom electrode material and the layer of top electrode material is formed over the layer of capacitor dielectric material;
   forming a layer of barrier material over the layer of top electrode material and the sidewall spacer; and
   forming a layer of aluminum capping (ALCAP) material over the layer of barrier material, wherein the layer of aluminum capping material comprises at least some of a top electrode of the MIM capacitor and the first metal comprises at least some of a bottom electrode of the MIM capacitor,
   wherein a second metal is located on the substrate and is laterally spaced from the first metal within the topmost metallization layer, and wherein the layers of bottom electrode material, capacitor dielectric material, top electrode material, barrier material and ALCAP material are also formed over the second metal as well as a dielectric material within the topmost metallization layer separating the first and second metals, and wherein the layers of ALCAP material, barrier material and top electrode material are removed over the first and second metals and the dielectric material to establish a resistor between the first and second metals, where the layer of bottom electrode material provides a conductive pathway between the first and second metals by extending between the first and second metals.

18. The method of claim 17, wherein the first and second metals comprise copper, and wherein respective first and second sides and a bottom of the first and second metals are surrounded by a layer of copper diffusion material comprising at least one of at least one of tantalum, tungsten, titanium, tantalum nitride, tantalum silicon nitride, titanium nitride, tungsten nitride, silicon nitride, silicon oxynitride and silicon carbide, and wherein the patterning is performed with an etchant that is selective to the layer of capacitor dielectric material.

19. A method of forming a MIM (metal insulator metal) capacitor, comprising:
   forming a sidewall spacer against an edge of a layer of bottom electrode material, an edge of a layer of capacitor dielectric material and at least some of an edge of a layer of top electrode material, wherein at least some of the layer of bottom electrode material is formed over a first metal formed within a topmost metallization layer on a substrate, the layer of capacitor dielectric material is formed over the layer of bottom electrode material and the layer of top electrode material is formed over the layer of capacitor dielectric material;
   forming a layer of barrier material over the layer of top electrode material and the sidewall spacer; and
   forming a layer of aluminum capping (ALCAP) material over the layer of barrier material, wherein the layer of aluminum capping material comprises at least some of a top electrode of the MIM capacitor and the first metal comprises at least some of a bottom electrode of the MIM capacitor,
   wherein at least some of the layer of bottom electrode material, at least some of the capacitor dielectric material and at least some of the top electrode material are formed down into first, second and third apertures defined over the first metal, wherein the respective edges of the layer of bottom electrode material, capacitor dielectric material and top electrode material do not reside within the first, second and third apertures nor does the sidewall spacer.

20. The method of claim 19
   wherein the first, second and third apertures have respective widths of about 2 micrometers or less,
   wherein the first, second and third apertures are separated by respective widths of about 2.875 micrometers or less, and
   wherein the first metal has a width of about 12.25 microns or less.

* * * * *